(12) United States Patent
Liu

(10) Patent No.: US 12,458,588 B2
(45) Date of Patent: Nov. 4, 2025

(54) BENEFIT AGENT DELIVERY SYSTEM USING ELECTROPLATING

(71) Applicant: E INK CORPORATION, Billerica, MA (US)

(72) Inventor: Lei Liu, Fremont, CA (US)

(73) Assignee: E Ink Corporation, Billerica, MA (US)

( * ) Notice: Subject to any disclaimer, the term of this patent is extended or adjusted under 35 U.S.C. 154(b) by 789 days.

(21) Appl. No.: 17/747,339

(22) Filed: May 18, 2022

(65) Prior Publication Data

US 2022/0372649 A1 Nov. 24, 2022

Related U.S. Application Data

(60) Provisional application No. 63/191,197, filed on May 20, 2021.

(51) Int. Cl.
*A61K 9/00* (2006.01)
*C25D 7/04* (2006.01)
*C25F 5/00* (2006.01)

(52) U.S. Cl.
CPC ............. *A61K 9/0009* (2013.01); *C25D 7/04* (2013.01); *C25F 5/00* (2013.01)

(58) Field of Classification Search
CPC .... A61K 9/0009; A61K 9/703; A61K 9/7084; A61K 9/7092; C25F 5/00; A61M 37/00; A61M 2037/0007; A61M 2205/0216; A61M 2205/0233; A61M 2205/0238; A61M 2207/10; A61M 35/10; A61M 35/00; A61M 2205/055; A61N 1/0428
See application file for complete search history.

(56) References Cited

U.S. PATENT DOCUMENTS

| | | | |
|---|---|---|---|
| 4,585,652 A | 4/1986 | Miller et al. | |
| 6,685,962 B2 | 2/2004 | Friedman et al. | |
| 6,933,098 B2 | 8/2005 | Chan-Park et al. | |
| 7,715,088 B2 | 5/2010 | Liang et al. | |
| 8,158,135 B2 | 4/2012 | Lehn et al. | |
| 10,087,344 B2 | 10/2018 | Moran | |
| 10,646,454 B2 | 5/2020 | Liu et al. | |
| 2017/0119960 A1* | 5/2017 | Dang ................ | A61M 5/14276 |

(Continued)

FOREIGN PATENT DOCUMENTS

CN 109908460 A 6/2019

OTHER PUBLICATIONS

Thomas.G. Harvey., "Replication techniques for micro-optics"., Proc. vol. 3099, pp. 76-82 (1997) Sep. 24, 1997.

(Continued)

*Primary Examiner* — Deanna K Hall
(74) *Attorney, Agent, or Firm* — Ioannis Constantinides

(57) ABSTRACT

A benefit agent delivery system whereby benefit agents can be delivered on demand. The benefit agent delivery system comprises a first electrode layer, a microcell layer, a sealing layer, and a second electrode layer. The microcell layer comprises a plurality of microcells, each microcell of the plurality of microcells containing a carrier and a benefit agent, and a metallic layer spanning an opening of each microcell of the plurality of microcells. Application of an electric field across a microcell causes the removal of at least a portion of the metallic layer from the microcell opening, and enabling the benefit agent to be delivered from the benefit agent delivery system.

15 Claims, 13 Drawing Sheets

(56) References Cited

U.S. PATENT DOCUMENTS

2018/0271799 A1\*  9/2018  Liu .................... A61K 9/0009
2018/0272114 A1   9/2018  Liu et al.
2019/0143105 A1   5/2019  Liu
2019/0374759 A1  12/2019  Zang
2021/0154133 A1   5/2021  Liu

OTHER PUBLICATIONS

European Patent Office, "Extended European Search Report", EP Appl. No. 22805379.9, Feb. 28, 2025. Feb. 28, 2025.
Korean Intellectual Property Office, "International Search Report and Written Opinion", PCT/US2022/029790, Sep. 5, 2022. Sep. 5, 2022.

\* cited by examiner

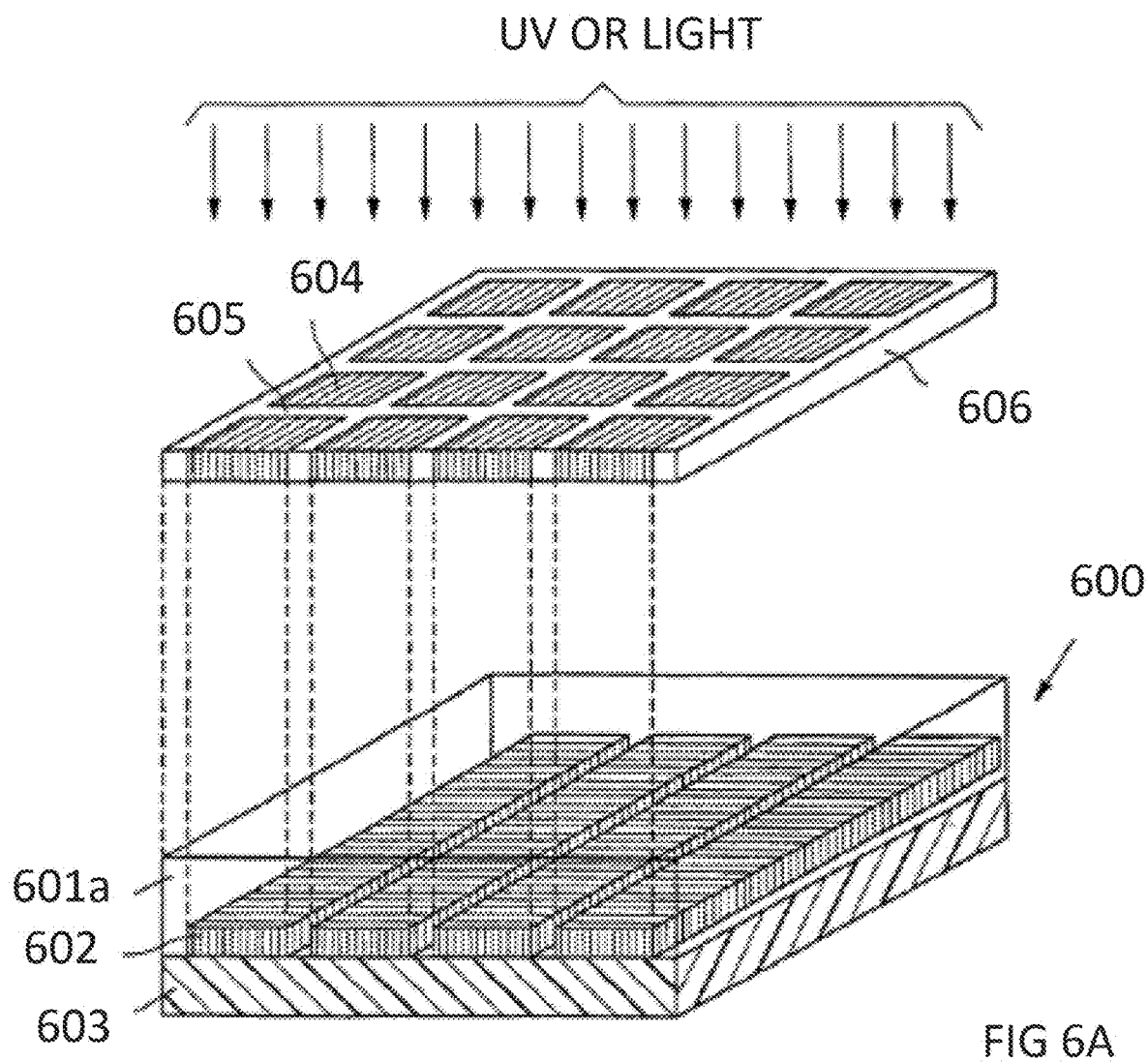
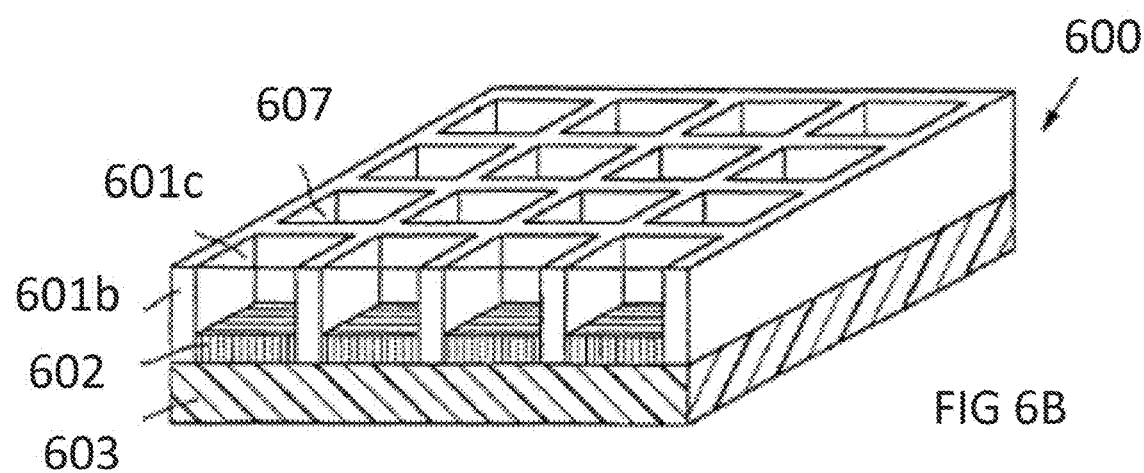
FIG 6A
FIG 6B

BENEFIT AGENT DELIVERY SYSTEM USING ELECTROPLATING

RELATED APPLICATIONS

This application claims priority to U.S. Provisional Patent Application No. 63/191,197, filed on May 20, 2021, which is incorporated by reference in its entirety, along with all other patents and patent applications disclosed herein.

BACKGROUND

The development of methodologies for controlled and extended release of benefit agents have attracted significant attention during the last decades. This is true for a large variety of benefit agents including pharmaceutical agents, nutraceutical agents, agricultural nutrients and related substances, cosmetic agents, fragrances, air care agents, and many other benefit agents in various fields. Transdermal delivery of pharmaceutical agents has proven effective for drugs that are able to move across the skin barrier. Small amounts of nicotine can be delivered over extended periods with transdermal patches that suspend the nicotine in an ethylene vinyl acetate (EVA) copolymer. An example of a transdermal patch is Nicoderm CQ® by GlaxoSmithKline (Brentford, UK). Other examples include extended release of fragrances and malodor removing agents for improving the air quality in living spaces and automobiles, fertilizers in the soil for more efficient food production, and biocides on surfaces for mitigating microorganism growth. Controlled and extended release delivery systems may involve the delivery of various benefit agents in different forms, such as solid, liquid and gas, to different locations and under various conditions.

A variety of delivery systems has been developed during the last decades that provide on demand delivery of benefit agents. For instance, Chrono Therapeutics (Hayward, CA) tested a micro pump enabled smart transdermal patch for delivering nicotine. Nonetheless, the corresponding device is large and visible through clothing as a sizeable bump. Thus, there remains a need for small, simple, inexpensive, versatile, and safe delivery systems for delivering benefit agents on demand.

SUMMARY

The present invention addresses this need by providing a low power delivery system whereby a benefit agent or a mixture of benefit agents can be released on demand. Additionally, as described below, the invention provides a system for delivering varying amounts of benefit agents from the same delivery system at different times, and for delivering multiple benefit agents at the same or different times from the same benefit agent delivery system.

In one aspect, the invention is a benefit agent delivery system comprising a first electrode layer, a microcell layer, a sealing layer, and a second electrode layer. The microcell layer comprises a plurality of microcells. Each microcell of the plurality of microcells includes an opening. Each microcell of the plurality of microcells contains a metallic layer and a medium, the metallic layer comprising a metal and spanning the opening of each microcell of the plurality of microcells. The medium comprises a carrier and a benefit agent. The sealing layer is located adjacent to the metallic layer of the microcell layer. The first electrode layer, the microcell layer, the sealing layer, and the second electrode layer are vertically stacked upon each other in this order. The metallic layer spanning the opening of each microcell of the plurality of microcells is a barrier and prevents the benefit agent from exiting the benefit agent delivery system through the sealing layer and the second electrode layer. The second electrode layer may be porous. When a voltage is applied from a voltage source between the first electrode layer and the second electrode layer across a microcell, at least a portion of the metallic layer is removed from the opening of the microcell. This enables the benefit agent to be released from the microcell through the sealing layer and the second electrode layer. That is, it is not necessary to totally remove the metallic layer from the opening of a microcell to enable the release of the benefit agent from a microcell. In one embodiment, the sealing layer and the second electrode layer are integrated into one layer. The first electrode layer may comprise a single electrode and the second electrode layer may comprise a single electrode or a plurality of electrodes. Alternatively, the first electrode layer may comprise a plurality of electrodes and the second electrode layer may comprise a single electrode.

The benefit agent delivery system may further comprise a voltage source that is coupled to the first electrode layer and the second electrode layer. Alternatively, the voltage source may be separate from the benefit agent delivery system and can be connected to the benefit agent delivery system when needed. When a voltage is applied from the voltage source, electric current may flow through the medium. When the voltage is applied from the voltage source between the first electrode layer and the second electrode layer across a microcell, at least a portion of the metallic layer may be removed from the metallic layer and deposited on the microcell surface opposite to the opening. The removal of at least a portion of the metallic layer from the opening of a microcell may be caused by oxidation of the metal of the metallic layer at the second electrode layer (anode), the dissolution of the formed metal salt into the carrier, the reduction of the metal salt, and the redeposition of the metallic layer near the first electrode layer (cathode).

In one embodiment, the plurality of microcells of the microcell layer may comprise one or more of a variety of benefit agents. The benefit agent may be a pharmaceutical agent, a vaccine, an antibody, a hormone, a protein, a nucleic acid, a nutraceutical agent, a nutrient, a cosmetic agent, a fragrance, a malodor removing agent, an agricultural agent, an air care agent, a preservative, an antimicrobial agent, and other benefit agents.

In one embodiment, the benefit agent may be dissolved or dispersed in the carrier. The carrier may be water, an organic compound, a silicone compound, or a combination thereof. The organic compound may be an alcohol, an ester, an amide, an ether, a carboxylic acid, or other organic compound. The organic compound may be an organic solvent. Non-limiting examples of organic solvents include DMSO, ethylene glycol, polyethylene glycol, propylene glycol, dipropylene glycol, glycerin, triethyl citrate, ethylene carbonate, and dimethyl carbonate.

In another aspect, the invention is a benefit agent delivery system comprising a first electrode layer, a microcell layer, and a second electrode layer. The microcell layer comprises a plurality of microcells. Each microcell of the plurality of microcells has a first opening and a second opening, the first opening and the second opening being at opposite sides of the microcell. Each microcell of the plurality of microcells comprises a metallic layer and a medium. The metallic layer comprises a metal. The medium comprises a benefit agent and a carrier. The first electrode layer spans the second opening of each microcell and the metallic layer spans the first opening of each microcell of the plurality of microcells. The first electrode layer, the microcell layer, and the second electrode layer are vertically stacked upon each other in this order. The second electrode layer is located adjacent to the metallic layer of the microcell layer. The metallic layer spanning the first opening of each microcell of the plurality of microcells is a barrier and prevents the benefit agent from exiting the benefit agent delivery system through the second electrode layer. The second electrode layer may be porous. When a voltage is applied from a voltage source between the first electrode layer and the second electrode layer across a microcell, at least a portion of the metallic layer is removed from the first opening of the microcell. This enables the benefit agent to be released from the microcell through the second electrode layer. That is, it is not necessary to totally remove the metallic layer from the first opening of a microcell to enable the release of the benefit agent from a microcell. In one embodiment, benefit agent delivery system may further comprise a sealing layer disposed between the microcell layer of each microcell and the second electrode layer. The sealing layer may be porous. The first electrode layer may comprise a single electrode and the second electrode layer may comprise a single electrode or a plurality of electrodes. Alternatively, the first electrode layer may comprise a plurality of electrodes and the second electrode layer may comprise a single electrode.

In yet another aspect, the invention is a method of operating a benefit agent delivery system comprising the steps of (1) providing a benefit agent delivery system comprising (a) a first electrode layer; (b) a microcell layer comprising a plurality of microcells, each microcell of the plurality of microcells including an opening, each microcell of the plurality of microcells containing a metallic layer and a medium, the metallic layer comprising a metal and spanning the opening of each microcell of the plurality of microcells, and the medium comprising a carrier and a benefit agent; (c) a sealing layer located adjacent to the metallic layer of the microcell layer; and (d) a second electrode layer; the first electrode layer, the microcell layer, the sealing layer and the second electrode layer being vertically stacked upon each other in this order; (2) applying a voltage potential difference between the first electrode layer and the second electrode layer across a microcell that causes the removal of at least a portion of the metallic layer from the opening of the microcell, enabling the release of the benefit agent from the benefit agent delivery system. The method of operating a benefit agent delivery system may further comprise a step of controlling the rate of delivery of the benefit agent by the selection of the applied voltage potential. The method of operating a benefit agent delivery system may further comprise a step of controlling the rate of delivery of the benefit agent by the selection of the duration of the application of the voltage potential.

In yet another aspect, the invention is a method of operating a benefit agent delivery system comprising the steps of (1) providing a benefit agent delivery system comprising (a) a first electrode layer; (b) a microcell layer comprising a plurality of microcells, each microcell of the plurality of microcells including an opening, each microcell of the plurality of microcells containing a metallic layer and a medium, the metallic layer comprising a metal and spanning the opening of each microcell of the plurality of microcells, and the medium comprising a carrier and a benefit agent; (c) a second electrode layer located adjacent to the metallic layer of the microcell layer; the first electrode layer, the microcell layer, and the second electrode layer being vertically stacked upon each other in this order; (2) applying a voltage potential difference between the first electrode layer and the second electrode layer across a microcell that causes the removal of at least a portion of the metallic layer from the opening of the microcell, enabling the release of the benefit agent from the benefit agent delivery system.

In yet another aspect, the invention is a method of operating a benefit agent delivery system comprising the steps of (1) providing a benefit agent delivery system comprising (a) a first electrode layer; (b) a microcell layer comprising a plurality of microcells, each microcell of the plurality of microcells including a first opening and a second opening, the first opening and the second opening being at opposite sides of each microcell, each microcell of the plurality of microcells containing a metallic layer and a medium, the metallic layer comprising a metal and spanning the first opening of each microcell of the plurality of microcells, the medium comprising a carrier and a benefit agent, the first electrode layer spanning the second opening of each microcell of the plurality of microcells; (c) a second electrode layer located adjacent to the metallic layer of the microcell layer; the first electrode layer, the microcell layer, and the second electrode layer being vertically stacked upon each other in this order; (2) applying a voltage potential difference between the first electrode layer and the second electrode layer across a microcell that causes the removal of at least a portion of the metallic layer from the second opening of the microcell, enabling the release of the benefit agent from the benefit agent delivery system. The benefit agent delivery system may further comprise a sealing layer disposed between the microcell layer of each microcell and the second electrode layer. The sealing layer may be porous.

In one aspect, the invention is a method for manufacturing of a benefit delivery system. The method comprises the steps of: (a) providing an empty microcell array comprising a first electrode layer, and a microcell layer comprising a plurality of microcells, each microcell of the plurality of microcells including an opening; (b) depositing a metal onto a surface of each microcell of the plurality of microcells, the surface being opposite to the opening, (c) filling each microcell of the plurality of microcells with a benefit agent and a carrier; (d) sealing each microcell of the plurality of microcells with a sealing layer, the sealing layer spanning the opening of each microcell of the plurality of microcells; (e) depositing a second electrode layer onto the sealing layer; and (f) applying an electric field between the first electrode layer and the second electrode layer, the first electrode layer being anode and the second electrode layer being cathode for each microcell, wherein the application of the electric field causes at least a portion of the metal of each microcell to be removed from the surface of the microcells that is opposite to the openings and be redeposited onto a surface spanning the microcell opening and adjacent to the sealing layer. The first electrode layer may comprise a single electrode and the second electrode layer may comprise a single electrode or a plurality of electrodes. The first electrode layer may comprise a plurality of electrodes and the second electrode layer may comprise a single electrode. The metal may be deposited onto the surface of each microcell of the plurality of microcells, the surface being opposite to the opening, (a) via chemical vapor deposition (gas phase) or (b) via spraying or coating a dispersion comprising a metal and a solvent. In case (b) the method may further comprise a step of drying the solvent of the deposited dispersion, before applying the electric field between the first electrode layer and the second electrode layer.

In one aspect, the invention is a method for manufacturing of a benefit delivery system. The method comprises the steps of: (a) providing an empty microcell array comprising a first electrode layer, and a microcell layer comprising a plurality of microcells, each microcell of the plurality of microcells including an opening; (b) depositing a metal onto a surface of each microcell of the plurality of microcells, the surface being opposite to the opening, (c) filling each microcell of the plurality of microcells with a benefit agent and a carrier; (d) depositing a second electrode layer onto the microcell layer; and (e) applying an electric field between the first electrode layer and the second electrode layer, the first electrode layer being anode and the second electrode layer being cathode for each microcell, wherein the application of the electric field causes at least a portion of the metal of each microcell to be removed from the surface of the microcells that is opposite to the openings and be redeposited onto a surface spanning the opening and adjacent to the second electrode layer.

In another aspect, the invention is a method for manufacturing of a benefit delivery system. The method comprises the steps of: (a) providing an empty microcell array comprising a first electrode layer, and a plurality of microcells, each microcell of the plurality of microcells including a first opening and a second opening, the first opening and the second opening being at opposite sides of the microcell, the first electrode layer spanning the second opening; (b) depositing a metal onto the first electrode layer surface that spans the second opening; (c) filling each microcell of the plurality of microcells with a benefit agent and a carrier; (d) depositing a second electrode layer onto the microcell layer, the second electrode layer spanning the first opening of each microcell of the plurality of microcells; (f) applying an electric field between the first electrode layer and the second electrode layer, the first electrode layer being anode and the second electrode layer being cathode for each microcell, wherein the application of the electric field causes at least a portion of the metal of each microcell to be removed from the second opening and be redeposited onto a surface spanning the first opening and adjacent to the second electrode layer.

In another aspect, the invention is a method for manufacturing of a benefit delivery system. The method comprises the steps of: (a) providing an empty microcell array comprising a first electrode layer, and a plurality of microcells, each microcell of the plurality of microcells including a first opening and a second opening, the first opening and the second opening being at opposite sides of the microcell, the first electrode layer spanning the second opening; (b) depositing a metal onto the first electrode layer surface that spans the second opening; (c) filling each microcell of the plurality of microcells with a benefit agent and a carrier; (d) sealing each microcell of the plurality of microcells with a sealing layer, the sealing layer spanning the first opening of each microcell of the plurality of microcells; (f) depositing a second electrode layer onto the sealing layer; (g) applying an electric field between the first electrode layer and the second electrode layer, the first electrode layer being anode and the second electrode layer being cathode for each microcell, wherein the application of the electric field causes at least a portion of the metal of each microcell to be removed from the second opening of the microcells and be redeposited onto a surface spanning the first opening and adjacent to the sealing layer.

BRIEF DESCRIPTION OF THE DRAWINGS

FIGS. 6A and 6B detail the production of microcells for an active molecule delivery system using photolithographic exposure through a photomask of a conductor film coated with a thermoset precursor;

In FIGS. 6C and 6D a combination of top and bottom exposure is used, allowing the walls in one lateral direction to be cured by top photomask exposure, and the walls in another lateral direction to be cured bottom exposure through the opaque base conductor film. This process allows microcell walls to be prepared with varying porosity for use with lateral motion embodiments;

DETAILED DESCRIPTION

Figure 1A:
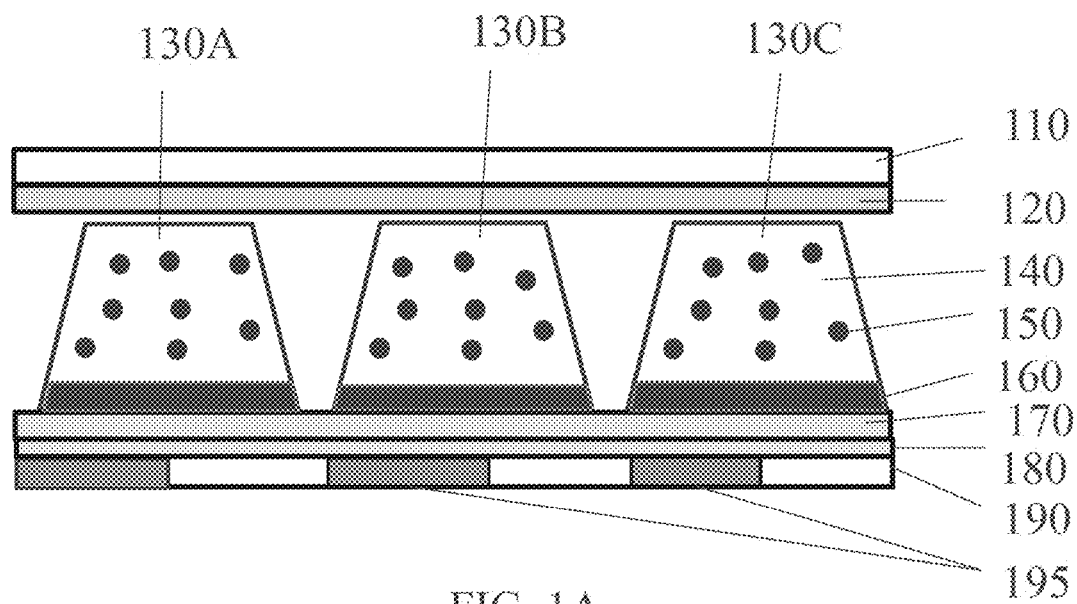
FIG. 1A illustrates an embodiment of a benefit agent delivery system including a first electrode layer, a plurality of microcells including an opening and comprising a metallic layer, a sealing layer, and a second electrode layer.

The invention provides a benefit agent delivery system whereby benefit agents can be released on demand and/or a variety of different benefit agents can be delivered from the same system and/or different concentrations of benefit agents can be delivered from the same system. The invention can be used to deliver a pharmaceutical agent, a vaccine, an antibody, a hormone, a protein, a nucleic acid, a nutrient, a nutraceutical agent, a cosmetic agent, a fragrance, a malodor removing agent, an air care agent, an agricultural agent, an air care agent, an antimicrobial agent, a preservative, and other benefit agents. Pharmaceutical agents and cosmetic agents may be delivered to patients transdermally. However, the invention may be used to deliver benefit agents to animals, generally. For example, the invention can deliver tranquilizing agents to a horse during transport. In addition, the invention may be used to deliver benefit agents to other surfaces or spaces.

"Adhesive layer" of the benefit agent delivery system is a layer that establishes an adhesive connection between two other layers of the system. An adhesive layer may have thickness of from 50 nm to 5 mm, or from 500 mm to 1 mm, or 1 μm to 100 μm.

"Porous diffusion layer" is a layer of the benefit agent delivery system that has average pore size that is larger than 0.2 nm.

"Rate control layer" is a layer of the benefit agent delivery system that has average pore size that is 0.2 nm or smaller.

The term "depositing a second electrode layer" includes any process of forming an electrode layer on a surface, such as laminating, coating, spraying, and others.

In one embodiment of the present invention, the benefit agent delivery system includes a first electrode layer, a microcell layer, a sealing layer, and a second electrode layer. The first electrode layer, the microcell layer, the sealing layer, and the second electrode layer are vertically stacked upon each other in this order. The benefit agent delivery system may also comprise a voltage source connecting the first electrode layer with the second electrode layer.

The microcell layer comprises a plurality of microcells containing a metallic layer and a medium. Each microcell of the plurality of microcells includes an opening. The largest dimension of the opening may be from 30 μm to 5 mm, or from 30 μm to 500 μm, or from 80 μm to 150 μm. The metallic layer comprises a metal and spans the opening of each microcell of the plurality of microcells. Each microcell of the plurality of microcells may have a volume greater than 0.01 nL, greater than 0.05 nL, greater than 0.1 nL, greater than 1 nL, greater than 10 nL, or greater than 100 nL, or greater than 1 μL, or greater than 10 μL. The medium comprises a carrier and a benefit agent.

The carrier may be a liquid, a semi-solid, a gel, such as a hydrogel, or combinations thereof. The carrier may comprise water, an organic compound, a silicone compound, or a combination thereof. The carrier may be a combination of water and at least one organic compound. The organic compound may be an alcohol, an ester, an amide, an ether, a carboxylic acid, or other organic compound. The organic compound may be an organic solvent such as DMSO, ethylene glycol, polyethylene glycol, propylene glycol, dipropylene glycol, glycerin, triethyl citrate, ethylene carbonate, dimethyl carbonate, or other organic solvent. The dielectric constant of the carrier may be from 5 to 80, or from 10 to 80, or from 20 to 80, or from 30 to 80, or from 40 to 80. The dielectric constant of the carrier may be higher than 5, or higher than 10, or higher than 20, or higher than 30, or higher than 40, or higher than 50, or higher than 60, or higher than 70. The organic compound may be a biocompatible liquid. In other embodiments, the carrier may be an aqueous liquid, such as water or an aqueous buffer. The content of carrier in the medium may be from 0.01 weight percent to 99.99 weight percent, or from 0.1 weight percent to 99 weight percent, or from 1 weight percent to 95 weight percent, or from 5 weight percent to 85 weight percent of carrier by weight of the medium. The medium may also comprise a polymeric material. In one example, a benefit agent may be dispersed in the polymeric material before it is added into the microcells.

The medium may also comprise one or more additives, such as charge control agents, rheology modifiers, buffers, and chelants. A charge control agent is typically a molecule comprising ionic or other polar groups, such as, for example, positive or negative ionic groups, which are preferably attached to a nonpolar chain (typically a hydrocarbon chain). Rheology modifiers are compounds, typically polymeric materials, which adjust the viscosity of the medium to the desired value. A chelant is a compound, which is able to chelate metal cations. The presence of the chelant may facilitate the removal of at least a portion of the metallic layer from the opening of the microcell. Non-limiting example of chelants include ethylenediaminetetraacetic acid (EDTA), ethylene diamine disuccinic acid (EDDS), aminotri (methylenephosphonic acid) (ATMP), 1,3-diamino-2-propanoltetraacetic acid (DTPA), dipicolinic acid (DPA), and ethylenediamine-N,N'-bis(2-hydroxyphenylacetic acid) (EDDHA). The medium may contain from 0.001 weight percent to 5 weight percent, or from 0.01 weight percent to 3 weight percent, or from 0.1 weight percent to 1 weight percent of a chelant by weight of the medium. A buffer is a material that controls the pH of the medium at a desirable pH range.

The metallic layer that spans the opening of microcells may comprise metal elements such as silver, copper, platinum, gold, zinc, nickel, chromium or combinations thereof. The thickness of the metallic layer may be from 1 nm to 20 μm, or from 10 nm to 10 μm, or from 30 nm to 15 μm, or from 50 nm to 10 μm, or from 100 nm to 5 μm, or from 1 μm to 3 μm.

The sealing layer may be constructed from a variety of natural or non-natural polymers. The sealing layer may comprise acrylates, methacrylates, polycarbonates, polyvinyl alcohols, cellulose, poly(N-isopropylacrylamide) (PNIPAAm), poly(lactic-co-glycolic acid) (PLGA), polyvinylidene chloride, acrylonitrile, amorphous nylon, oriented polyester, terephthalate, polyvinyl chloride, polyethylene, polypropylene, polystyrene, polyurethane or alginate. The sealing layer may also comprise a conductive material such as carbon black, carbon nanotubes, graphene, metal particles, or a conductive polymer. Non-limiting examples of conductive polymers that can be used in the sealing layer include PEDOT-PSS, polyacetylene, polyphenylene sulfide, polyphenylene vinylene, or combinations thereof. The sealing layer may have thickness of from 500 nm to 3 mm, or from 500 nm to 1 mm, or from 1 μm to 100 μm. Non-limiting examples of metal particles include metal nanoparticles, metal nanowires, metal nanofibers or combinations thereof.

The microcell layer and the sealing layer are disposed between the first electrode layer and the second electrode layer. The first electrode layer and the second electrode layer of the benefit agent delivery system of the invention may be of the same or different types. In one example of the benefit agent delivery system, the first electrode layer comprises a single electrode and the second electrode layer comprises a single electrode. In another example of the benefit agent delivery system, the first electrode layer comprises a single electrode and the second electrode layer comprises a plurality of electrodes. In yet another example of the benefit agent delivery system, the first electrode layer comprises a plurality of electrodes and the second electrode layer comprises a single electrode. A single electrode may be a continuous conductive material or a mesh from a conductive material having electrically interconnected rows and columns. In an electrode layer comprising a plurality of electrodes, each of the plurality of electrodes may be independently addressed.

The second electrode layer may comprise a single electrode or a plurality of electrodes. Each of the plurality of electrodes may be independently addressed. The average largest dimension of each of the plurality electrodes may be from 4 µm to 50 mm, or 10 µm to 1 mm, or from 100 µm to 500 or from 200 to 400 µm. The second electrode layer may be porous and permeable to the benefit agent, having average pore size larger than 0.2 nm, or larger than 10 nm, or larger than 100 nm, or larger than 1 µm, or larger than 10 µm, or larger than 100 µm. The second electrode layer may also have average pore size less than 0.2 nm. In general, the smaller the average pore size, the lower the rate of delivery of the benefit agent from the delivery system.

The first electrode layer may also comprise a single electrode or a plurality of electrodes, wherein each of the plurality of electrodes may be independently addressed. The first electrode layer may comprise a single electrode formed from a continuous conductive material. The continuous conductive material may be a preformed conductor film, such as indium tin oxide (ITO) conductor lines. Other conductive materials, such as silver or aluminum, may also be used. The thickness of the first electrode layer may be from 500 nm to 5 mm, or from 1 µm to 500 µm. In the case where the first electrode layer is continuous conductive material such as ITO, the thickness of the electrode layer may be from 0.1 nm to 300 µm, or from 1 nm to 50 µm, or from 100 nm to 10 µm.

The benefit agent delivery system comprises a plurality of microcells having a metallic layer spanning the opening of each microcell of the plurality of microcells. The metallic layer may be initially impermeable (or may have low permeability) to the benefit agent as depicted in FIG. 1A. Upon application of a voltage between the first electrode layer and a second electrode layer of a microcell, at least a portion of the metallic layer may be removed from the opening of the microcell. The metal of the metallic layer may migrate through the microcell and may be deposited onto the inside surface of the microcell on the opposite side of the opening of the microcell or in nearby walls. The applied voltage may be from 0.1 V to 240 V, or from 5 to 130 V, or from 20 to 80 V. The duration of the application of the voltage may be from 1 second to 120 minutes, or from 10 seconds to 60 minutes, or from 1 minute to 30 minutes. When a voltage is applied from a voltage source between the first electrode layer and the second electrode layer, the resulting electric current may flow through the carrier. It is likely that the metal of the metallic layer is oxidized to the corresponding metal salt near the anode with the application of the electric field. The metal salt may be dissolved into the carrier of the microcell and then it may be reduced near the cathode into its metal form and redeposited on the inside surface of the microcell opposite to the opening of the microcell. The process enables the activation of the microcell. That is, the benefit agent may now permeate the sealing layer and the second electrode layer as depicted in FIG. 1B.

Figure 1B:
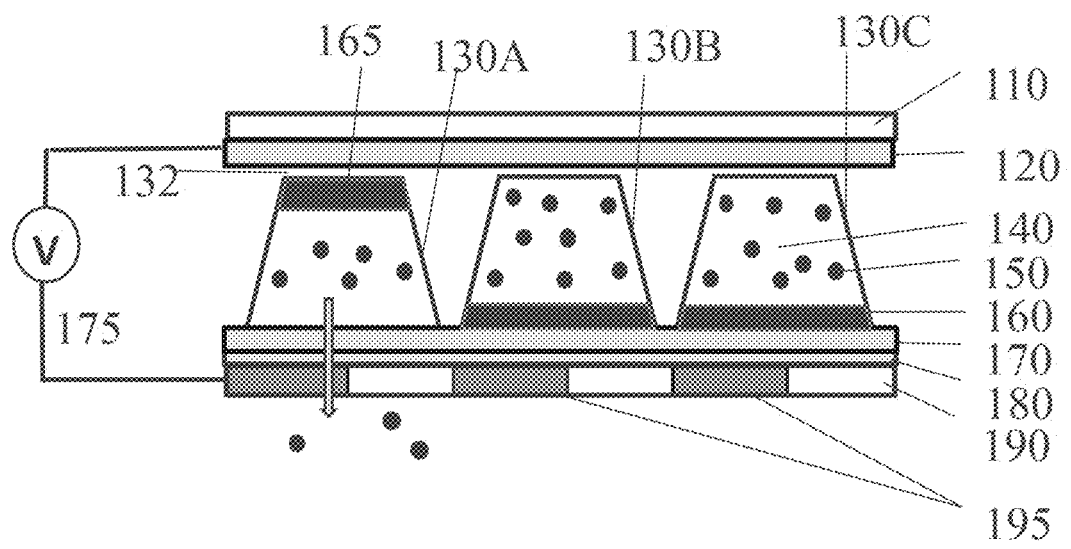
FIG. 1B illustrates an embodiment of a benefit agent delivery system including a voltage source. In the system depicted in FIG. 1B, the benefit agent may pass through the sealing layer and the second electrode layer of one of the microcells to be delivered where desired.

As a result, the benefit agent may exit the corresponding microcell, as the arrow of FIG. 1B shows, to be delivered on the desired surface or space. The polarity of the voltage that triggers the removal of at least a portion of the metallic layer from the opening of the microcell and the activation of the microcell is such that the plurality of electrodes of the second electrode layer has a positive potential (anode). The ability to remove at least a portion of the metallic layer by the application of a voltage enables the delivery of the benefit agent on demand. Because the benefit agent delivery system may comprise a plurality of microcells that can be independently activated on demand, the system has the flexibility of delivering variable quantities of benefit agents at different times. Additionally, the microcell arrays may be loaded with different benefit agents, thereby providing a mechanism to deliver different or complimentary benefit agents on demand.

The benefit agent delivery system of the present invention may be the basis for delivering agricultural nutrients. The microcell arrays can be fabricated in large sheets that can be used in conjunction with hydroponic growing systems, or they can be integrated into hydrogel film farming, such as demonstrated by Mebiol, Inc. (Kanagawa, Japan). The benefit agent delivery system can be incorporated into the structural walls of smart packing, as well. The delivery system, for example, makes it possible to have long-term release of antioxidants into a package containing fresh vegetables or other items. Such packaging could dramatically improve the shelf life of certain foods and other items yet will only require the amount of antioxidant necessary to maintain freshness until the package is opened.

An overview of a benefit agent delivery system is shown in FIG. 1A. The system may include a backing layer 110, a first electrode layer 120, a microcell layer, a sealing layer 170, an adhesive layer 180, and a second electrode layer 190. The microcell layer comprises a plurality of microcells (130A, 130B, 130C). The microcell layer and the sealing layer 160 are disposed between a first electrode layer 120 and a second electrode layer 190. Often the system will additionally include an adhesive layer 180, disposed between the sealing layer 170 and the second electrode layer 190. The horizontal cross section of the microcells may have different shapes, for example, square, round, or polygonal, such as a honeycomb structure. Each microcell (130A, 130B, 130C) of the plurality of microcells of the microcell layer includes a metallic layer 160 and a medium. The medium comprises a carrier 140 and a benefit agent 150. The benefit agent 150 is shown in FIG. 1A (and in FIGS. 1B, IC, 2, 7, 8, 9, 10, 11, and 12) as a separate macroscopic entity from the carrier, which may imply that the benefit agent exists as a different phase from the carrier. However, it should be assumed that this representation of the benefit agent includes the option that the benefit agent exists in a molecular state or in any other form, wherein the presence of the benefit agent is not apparently visible as a separate phase. Examples include solutions, microemulsions, nanoemulsions, colloidal dispersions, etc. Each microcell is part of an array that is formed from a polymer matrix, which is described in more detail below. The benefit agent delivery system will typically include a backing layer 110 to provide structural support. The backing layer may have thickness of from 1 µm to 5 mm, or from 25 µm to 300 µm.

The sealing layer may also comprise a benefit agent, which is the same or different from a benefit agent that is included ill the medium of the microcells. The benefit agent may be incorporated ill the sealing layer when the sealing layer composition is prepared and before the sealing layer is used during the preparation of the benefit agent delivery system.

The second electrode layer 190 may be a mesh from a metallic material having rows and columns. The second electrode layer may also comprise one electrode or a plurality of electrodes 195. The second electrode layer and the sealing layer may be porous. The second electrode layer 190 and the sealing layer 170 may be integrated into one layer. The adhesive layer may also be porous and it may have thickness of from 50 nm to 5 mm, or from 500 nm to 1 mm, or 1 μm to 100 μm.

FIG. 1B shows an example of a benefit agent delivery system after the activation of a microcell. The benefit delivery system of FIG. 1B further comprises a voltage source 175 that couples the first electrode layer 120 and the second electrode layer 190. The second electrode layer comprises a plurality of electrodes 195. As described above, the activation takes place via the application of a voltage across the microcell, leading to the removal of the metallic layer 160 from the opening of the microcell. Although not shown in FIG. 1B, it is possible to remove only a portion of the metallic layer 160 from the opening of the microcell rather than removing all of the metallic layer. The metal of the metallic layer 160 may migrate to be redeposited onto a surface of the microcell opposite to the opening (see layer 165). Thus, the benefit agent can be delivered outside the benefit agent delivery system after its migration across the sealing layer 170, the adhesive layer 180, and the second electrode layer 190. The rate of delivery of the benefit agent can be controlled by a variety of ways. Examples include the amount of the metal of the metallic layer 160, and the thickness, permeability/porosity of the sealing, adhesive and second electrode layers. Other parameters that may affect the rate of delivery include the nature of the benefit agent, the nature of the carrier, and the concentration of the benefit agent in the carrier composition. The inclusion of a rate control layer in the benefit agent delivery system may also control the rate of delivery, as described in more detail below. The benefit agent may be present in the microcell in a molecular form, that is, as a solution in the carrier and/or as an entity in a different phase as a dispersion or an emulsion. In the latter case (different phase), the particle or droplet size of the dispersion or emulsion will also affect the rate of delivery. The duration of the delivery of the benefit agent can be also controlled by the magnitude and duration of the applied electric field. Application of higher voltage typically results in higher rate of delivery of the benefit agent. Longer duration of the application of the voltage also results in higher rate of delivery of the benefit agent. The useful physical form of the benefit agent may be gaseous, independently of the actual physical form exiting the benefit agent delivery system. For example, fragrance molecules vaporize to reach the nasal odor sensors of the user before they are detected. Thus, this kind of benefit agents may exit the delivery system as a liquid or a gas.

As mentioned above, the activation of microcell 130A of the benefit delivery system of FIG. 1A requires the application of electric field between the first electrode layer 120 and an electrode of the second electrode layer at the microcell. The electric field may result in electric current, which flows through the medium of the microcell, oxidizing the metallic layer 160, removing the metallic layer 160 from the opening of the microcell and redeposit the metal of the metallic layer on the surface of microcell 130A across from the opening as metallic layer 165. The application of the electric field may remove all of the metallic layer or only a portion of the metallic layer 165. The amplitude of the required voltage of the electric field applied by the voltage source 175 to generate an effective electric current through the medium depends, among other parameters, on the thickness of the bottom layer 132 of microcell 130A. Bottom layer of a microcell of a microcell layer is the layer that separates the first electrode layer and the inside surface of an empty microcell across from the opening of the microcell. Benefit agent delivery systems having thicker bottom layers 132 of microcell 130A require higher amplitude of applied voltage than benefit agent delivery systems having thinner bottom layers 132 of microcell 130A for the activation of the microcell at similar delivery rates. The bottom layer of microcell of benefit agent delivery system of the present invention may have thickness less than 300 μm, or less than 100 μm, or less than 10 μm, or less than 1 μm. The bottom layer of microcell of benefit agent delivery system of the present invention may have thickness of from 50 nm to 300 μm, or from 100 nm to 100 μm, or from 500 nm to 50 μm, or from 1 μm to 10 μm.

Figure 1C:
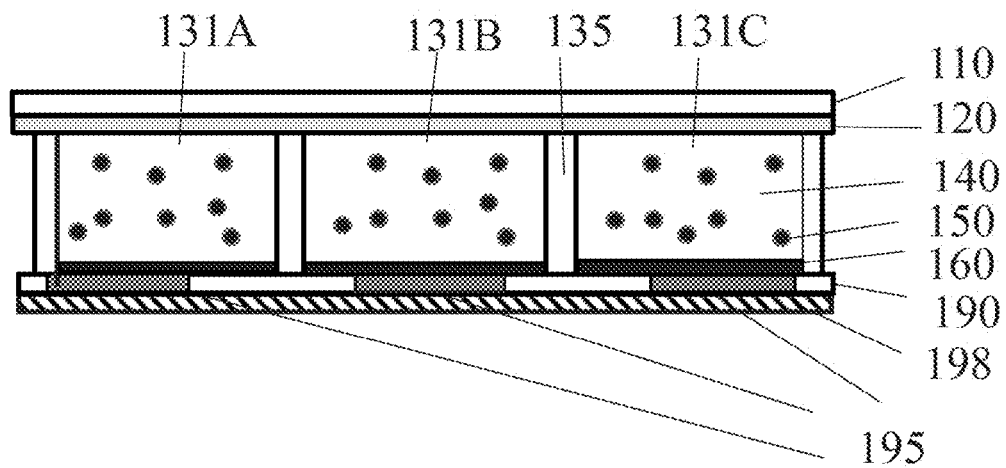
FIG. 1C illustrates a benefit agent delivery system including a first electrode layer, a plurality of microcells each of which has two openings, and a second electrode layer; each microcell of the plurality of microcells comprises a metallic layer and a benefit agent in a carrier.

Another embodiment of a benefit agent delivery system of the present invention is shown in FIG. 1C. The benefit agent delivery system comprises a backing layer 110, a first electrode layer 120, a microcell layer comprising a plurality of microcells (131A, 131B, 131C), and a second electrode layer 190. The second electrode layer comprises a plurality of electrodes 195. The benefit agent delivery system may also comprise a release sheet 198. In this embodiment, each microcell of the plurality of microcells (131A, 131B, 131C) has two openings, a first opening and a second opening. The first opening and the second opening are at opposite sides of the microcell. Microcell walls 135 separate the microcells from each other. Each microcell of the plurality of microcells comprises a metallic layer 160, a carrier 140, and a benefit agent 150. The first electrode layer 120 spans the second opening of each microcell of the plurality of microcells and the metallic layer 160 spans the first opening of each microcell of the plurality of microcells. In this embodiment, the first electrode layer 120 and the metallic layer 160 are in contact with the medium that is included in each microcell of the plurality of microcells. In this embodiment of the benefit agent delivery system of the present invention, the first electrode layer of a non-activated microcell of the microcell layer is in direct contact with the medium of the non-activated microcell. This enables the activation of a microcell of a benefit agent delivery system of this embodiment to be achieved by the application of lower voltage than the activation of a microcell of a benefit agent delivery system of the embodiment illustrated by FIG. 1A. In the case of benefit agent delivery system of the embodiment illustrated by FIGS. 1A and 1B, the first electrode layer is not in direct contact with the medium of a non-activated microcell. Analogously, in the embodiment of the benefit agent delivery system of the present invention illustrated by FIG. 1C, the second electrode layer of an activated microcell of the microcell layer is in direct contact with the medium of the activated microcell. This enables the deactivation of a microcell of a benefit agent delivery system of this embodiment to be achieved by the application of lower voltage than the deactivation of a microcell of a benefit agent delivery system of the embodiment illustrated by FIG. 1A. Deactivation of an activated microcell is the process wherein application of electric field across an activated microcell, removes at least a portion of the metallic layer from the surface of the microcell adjacent to the first electrode layer and redeposition of at least a portion the metallic layer onto a surface adjacent to the sealing layer (for the embodiment illustrated by FIGS. 1A and 1B) or redeposition of (at least a portion) of the metallic layer onto a surface adjacent to the second electrode layer (for the embodiment illustrated by FIG. IC).

Figure 2:
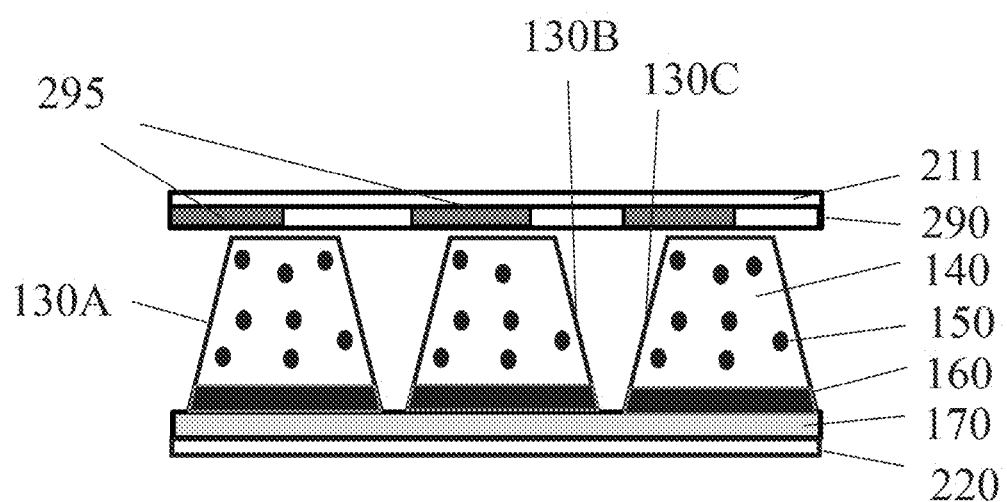
FIG. 2 illustrates an embodiment of a benefit agent delivery system that includes a first electrode layer comprising a plurality of electrodes, a plurality of microcells, a sealing layer, and a second electrode layer comprising a single electrode; upon activation of the system, the benefit agent may be delivered through the second electrode layer.

In another embodiment illustrated by FIG. 2, the benefit agent delivery system includes a first electrode layer 290, a microcell layer comprising a plurality of microcells (130A 130B, 130C), a sealing layer 170, and a second electrode layer 220. The first electrode layer 290, the microcell layer, the sealing layer 160, and the second electrode layer 220 are vertically stacked upon each other. The benefit agent delivery system may also comprise a backing layer 211 as well as a voltage source that connects the first electrode layer 290 and the second electrode layer 220. Each microcell of the plurality of microcells includes a metallic layer 160 and a medium comprising a carrier 140 and a benefit agent 150. Each microcell of the plurality of microcells includes an opening. The metallic layer spans the opening of the microcells. In this embodiment, the first electrode layer 290 comprises multiple electrodes 295 (plurality of electrodes), whereas the second electrode layer 220 comprises a single electrode that is formed from a conductive material such as ITO. Application of electric field across a microcell may remove at least a portion of the metallic layer 160 from the opening of the microcell, enabling the delivery of the benefit agent from the benefit delivery system through the sealing layer 170 and the second electrode layer 220.

Figure 3A:
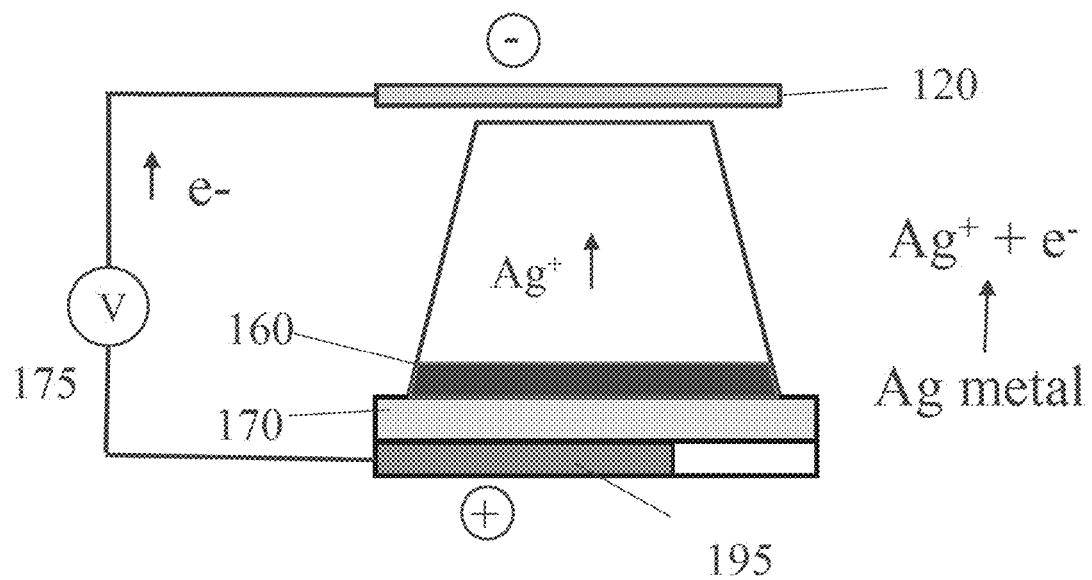
FIGS. 3A and 3B illustrates a possible mechanism for the removal of at least a portion of the metallic layer from the opening of a microcell.
Figure 3B:
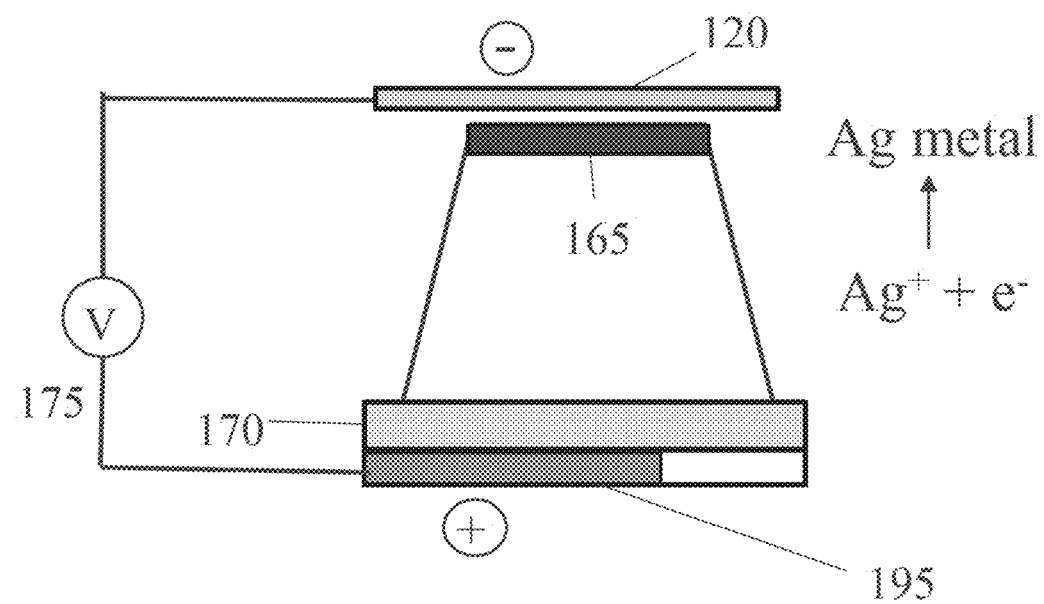

The activation of a microcell of a benefit agent delivery system is achieved by applying a voltage between the first electrode layer 120 and the corresponding electrode 195, as illustrated in FIGS. 3A and 3B. The application of the voltage may result in an electric current, which flows through the carrier of the microcell. In the embodiment illustrated in FIGS. 3A and 3B, the metallic layer 160 of the microcell spans the opening of a microcell, as illustrated in FIG. 3A. The metallic layer 160 comprises silver metal. The applied voltage 175 is such that the electrode 195 has positive polarity. The silver metal of the metallic layer 160 is removed at least partially from the opening and is redeposited onto the inside surface of the microcell (165). It is likely that this is the result of oxidization of the silver metal (which may comprise silver nanofibers) to silver salts comprising silver cation (Ag+), which may dissolve in the carrier of the microcell and may move towards the first electrode layer 120. The electrons generated from the metal oxidation may also move towards the first electrode layer 120 via the electrical coupling between the first electrode layer 120 and electrode 195. In FIG. 3B, the result of this process is illustrated. The silver cations may be reduced to silver metal on the inside surface of the microcell adjacent to the first electrode layer by the transferred electrons. The metallic silver is then deposited on the inside surface of the microcell (165). The migration of the silver of the metallic layer 160 activates the microcell, enabling the delivery of the benefit agent, which is present in the microcell. The benefit agent delivery system has reversibility. That is, the user may activate a microcell by applying an electric field of a polarity and amplitude to remove at least a portion of the metallic layer from the opening of the microcell. The user may then apply an electric field of opposite polarity on the activated microcell to redeposit the metallic layer onto the opening of the microcell. This provides additional control of the delivery of a benefit agent.

Figure 4:
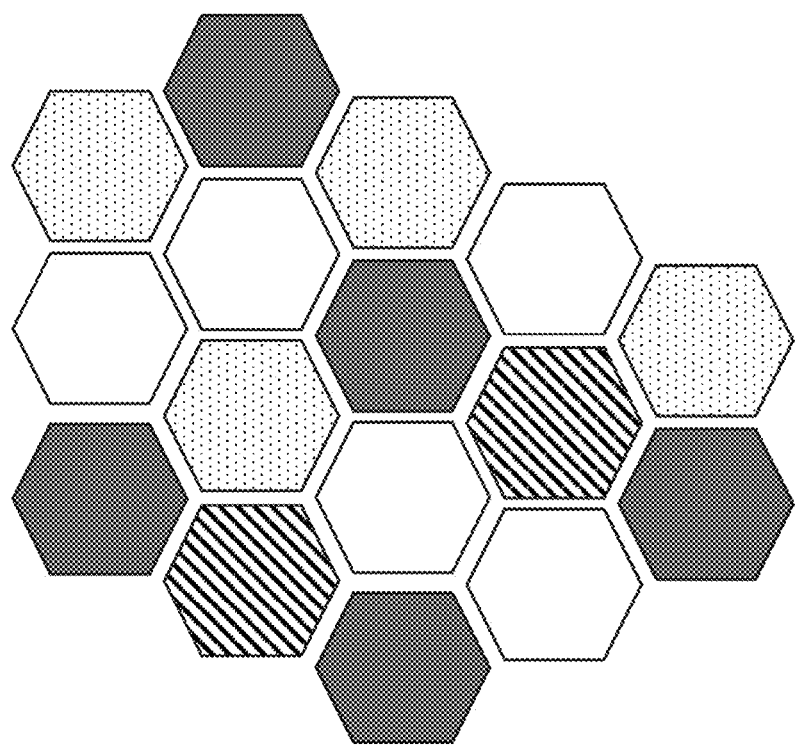
FIG. 4 illustrates a benefit agent delivery system including a plurality of different types of benefit agents and/or a plurality of concentrations of benefit agents in the same delivery system.

In addition to regulating the rate of delivery of benefit agent, the microcell construction of the invention lends itself to making arrays of differing benefit agents, or arrays of different concentrations, as illustrated in FIG. 4. Because the microcells can be individually activated with an active matrix of electrodes, it is possible to provide varying benefit agents on demand and to produce complex dosing profiles. Using injection with inkjet or other fluidic systems, individual microcells can be filled to enable a variety of different benefit agents to be included in a benefit agent delivery system. For example, a system of the invention may include nicotine at four different concentrations, thereby allowing different dosages to be delivered at different times during the day. For example, shortly after waking up the most concentrated dose may be delivered (dark gray), followed by a much lower taper dose during the day (speckled), until the time that a user needs another more concentrated dose. It is possible to include different benefit agents in the same microcell. For example, the system illustrated in FIG. 4 may also include an analgesic (stripes) to reduce swelling and itching in the area of the skin that is in contact with the delivery system. Of course, a variety of combinations are possible, and varying microcells might include pharmaceuticals, nutraceuticals, nutrients, adjuvants, vitamins, vaccines, hormones, cosmetic agents, fragrances, preservatives, etc. Furthermore, the arrangement of the microcells may not be distributed. Rather, the microcells may be filled in clusters, which makes filling and activation more straightforward. In other embodiments, smaller microcell arrays may be filled with the same medium, i.e., having the same benefit agent at the same concentration, and then the smaller arrays assembled into a larger array to make a delivery system of the invention.

In another embodiment of the benefit agent delivery system, a microcell may contain a mixture of benefit agents. Because the invention includes a plurality of microcells, it is possible to have different microcells within the same benefit delivery system containing different combinations of benefit agents or similar combinations having different concentrations. For example, a system may include a first type of microcells containing a first benefit agent and a second type of microcells containing a second benefit agent, or a system may include a first type of microcells containing a benefit agent at a first concentration and a second type of microcells containing the same benefit agent at a second concentration. In other embodiments, the system may include a first type of microcells containing a benefit agent and a second type of microcells containing an adjuvant. Other combinations of benefit agents, additives, and concentrations will be evident to one of skill in the art.

Figure 5:
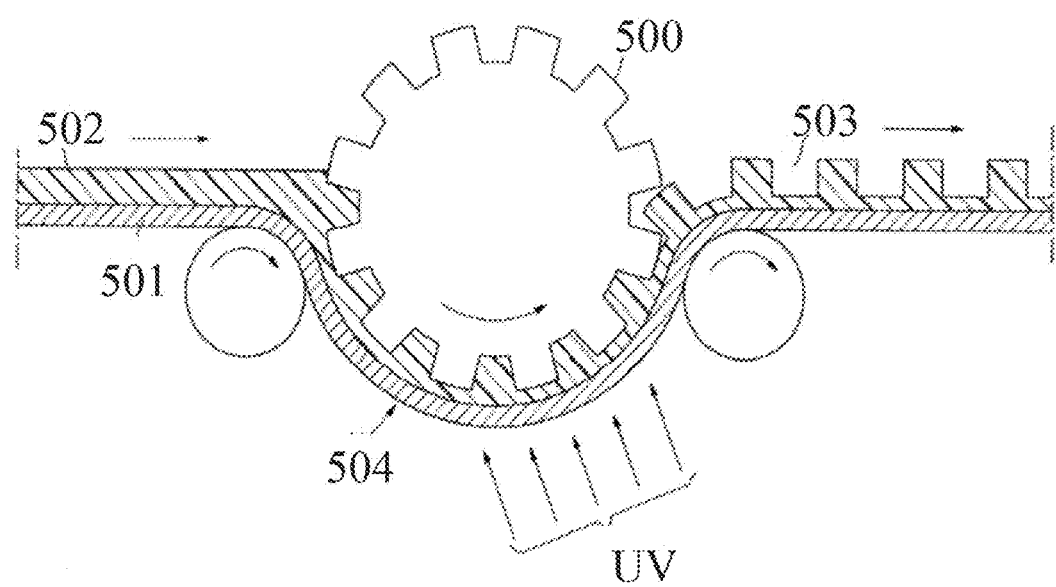
FIG. 5 shows a method for making microcells for the invention using a roll-to-roll process.

Techniques for constructing microcells. Microcells may be formed either in a batchwise process or in a continuous roll-to-roll process as disclosed in U.S. Pat. No. 6,933,098. The latter offers a continuous, low cost, high throughput manufacturing technology for production of compartments for use in a variety of applications including benefit agent delivery and electrophoretic displays. Microcell arrays suitable for use with the invention can be created with microembossing, as illustrated in FIG. 5. A male mold 500 may be placed either above the web 504 or below the web 504 (not shown); however, alternative arrangements are possible. For examples, please see U.S. Pat. No. 7,715,088, which is incorporated herein by reference in its entirety. A conductive substrate may be constructed by forming a conductor film 501 on polymer substrate that becomes the backing for a device. A composition comprising a thermoplastic, thermoset, or a precursor thereof 502 is then coated on the conductor film. The thermoplastic or thermoset precursor layer is embossed at a temperature higher than the glass transition temperature of the thermoplastics or thermoset precursor layer by the male mold in the form of a roller, plate or belt.

The thermoplastic or thermoset precursor for the preparation of the microcells may be multifunctional acrylate or methacrylate, vinyl ether, epoxide and oligomers or polymers thereof, and the like. A combination of multifunctional epoxide and multifunctional acrylate is also very useful to achieve desirable physico-mechanical properties. A cross-linkable oligomer imparting flexibility, such as urethane acrylate or polyester acrylate, may be added to improve the flexure resistance of the embossed microcells. The composition may contain polymer, oligomer, monomer and additives or only oligomer, monomer and additives. The glass transition temperatures (or $T_g$) for this class of materials usually range from about −70° C. to about 150° C., preferably from about −20° C. to about 50° C. The microembossing process is typically carried out at a temperature higher than the $T_g$. A heated male mold or a heated housing substrate against which the mold presses may be used to control the microembossing temperature and pressure.

As shown in FIG. 5, the mold is released during or after the precursor layer is hardened to reveal an array of microcells 503. The hardening of the precursor layer may be accomplished by cooling, solvent evaporation, crosslinking by radiation, heat or moisture. If the curing of the thermoset precursor is accomplished by UV radiation, UV may radiate onto the transparent conductor film from the bottom or the top of the web as shown in the two figures. Alternatively, UV lamps may be placed inside the mold. In this case, the mold must be transparent to allow the UV light to radiate through the pre-patterned male mold on to the thermoset precursor layer. A male mold may be prepared by any appropriate method, such as a diamond turn process or a photoresist process followed by either etching or electroplating. A master template for the male mold may be manufactured by any appropriate method, such as electroplating. With electroplating, a glass base is sputtered with a thin layer (typically 3000 Å) of a seed metal such as chrome inconel. The mold is then coated with a layer of photoresist and exposed to UV. A mask is placed between the UV and the layer of photoresist. The exposed areas of the photoresist become hardened. The unexposed areas are then removed by washing them with an appropriate solvent. The remaining hardened photoresist is dried and sputtered again with a thin layer of seed metal. The master is then ready for electroforming. A typical material used for electroforming is nickel cobalt. Alternatively, the master can be made of nickel by electroforming or electroless nickel deposition. The floor of the mold is typically between 50 to 400 microns. The master can also be made using other microengineering techniques including e-beam writing, dry etching, chemical etching, laser writing or laser interference as described in "Replication techniques for micro-optics", SPIE Proc. Vol. 3099, pp. 76-82 (1997). Alternatively, the mold can be made by photomachining using plastics, ceramics or metals.

Prior to applying a UV curable resin composition, the mold may be treated with a mold release to aid in the demolding process. The UV curable resin may be degassed prior to dispensing and may optionally contain a solvent. The solvent, if present, readily evaporates. The UV curable resin is dispensed by any appropriate means such as, coating, dipping, pouring or the like, over the male mold. The dispenser may be moving or stationary. A conductor film is overlaid the UV curable resin. Pressure may be applied, if necessary, to ensure proper bonding between the resin and the plastic and to control the thickness of the floor of the microcells. The pressure may be applied using a laminating roller, vacuum molding, press device or any other like means. If the male mold is metallic and opaque, the plastic substrate is typically transparent to the actinic radiation used to cure the resin. Conversely, the male mold can be transparent and the plastic substrate can be opaque to the actinic radiation. To obtain good transfer of the molded features onto the transfer sheet, the conductor film needs to have good adhesion to the UV curable resin, which should have a good release property against the mold surface.

Microcell arrays for the invention typically include a preformed conductor film, such as indium tin oxide (ITO) conductor lines; however, other conductive materials, such as silver or aluminum, may be used. The first electrode layer may be backed by or integrated into substrates such as polyethylene terephthalate, polyethylene naphthalate, polyaramid, polyimide, polycycloolefin, polysulfone, epoxy and their composites. The conductor film may be coated with a radiation curable polymer precursor layer. The film and precursor layer are then exposed imagewise to radiation to form the microcell wall structure. Following exposure, the precursor material is removed from the unexposed areas, leaving the cured microcell walls bonded to the conductor film/support web. The imagewise exposure may be accomplished by UV or other forms of radiation through a photomask to produce an image or predetermined pattern of exposure of the radiation curable material coated on the conductor film. Although it is generally not required, the mask may be positioned and aligned with respect to the conductor film, i.e., ITO lines, so that the transparent mask portions align with the spaces between ITO lines, and the opaque mask portions align with the ITO material (intended for microcell cell floor areas).

Photolithography. Microcells can also be produced using photolithography. Photolithographic processes for fabricating a microcell array are illustrated in FIGS. 6A and 6B. As shown in FIGS. 6A and 6B, the microcell array 600 may be prepared by exposure of a radiation curable material 601a coated by known methods onto a conductor electrode film 602 to UV light (or alternatively other forms of radiation, electron beams and the like) through a mask 606 to form walls 601b corresponding to the image projected through the mask 606. The base conductor film 602 is preferably mounted on a supportive substrate base web 603, which may comprise a plastic material.

In the photomask 606 in FIG. 6A, the dark squares 604 represent the opaque area and the space between the dark squares represents the transparent area 605 of the mask 606. The UV radiates through the transparent area 605 onto the radiation curable material 601a. The exposure is preferably performed directly onto the radiation curable material 601a, i.e., the UV does not pass through the substrate 603 or base conductor 602 (top exposure). For this reason, neither the substrate 603, nor the conductor 602, needs to be transparent to the UV or other radiation wavelengths employed.

As shown in FIG. 6B, the exposed areas 601b become hardened and the unexposed areas (protected by the opaque area 604 of the mask 606) are then removed by an appropriate solvent or developer to form the microcells 607. The solvent or developer is selected from those commonly used for dissolving or reducing the viscosity of radiation curable materials such as methylethylketone (MEK), toluene, acetone, isopropanol or the like. The preparation of the microcells may be similarly accomplished by placing a photomask underneath the conductor film/substrate support web and in this case the UV light radiates through the photomask from the bottom and the substrate needs to be transparent to radiation.

The photolithography methodology described in the previous three paragraphs may be utilized to manufacture the benefit agent delivery system illustrated in FIG. 1C, wherein each of the plurality of microcells has two openings, a first opening and a second opening at opposite sides of the microcell, wherein the first electrode layer spans the second opening and the metallic layer spans the first opening.

Figure 6C:
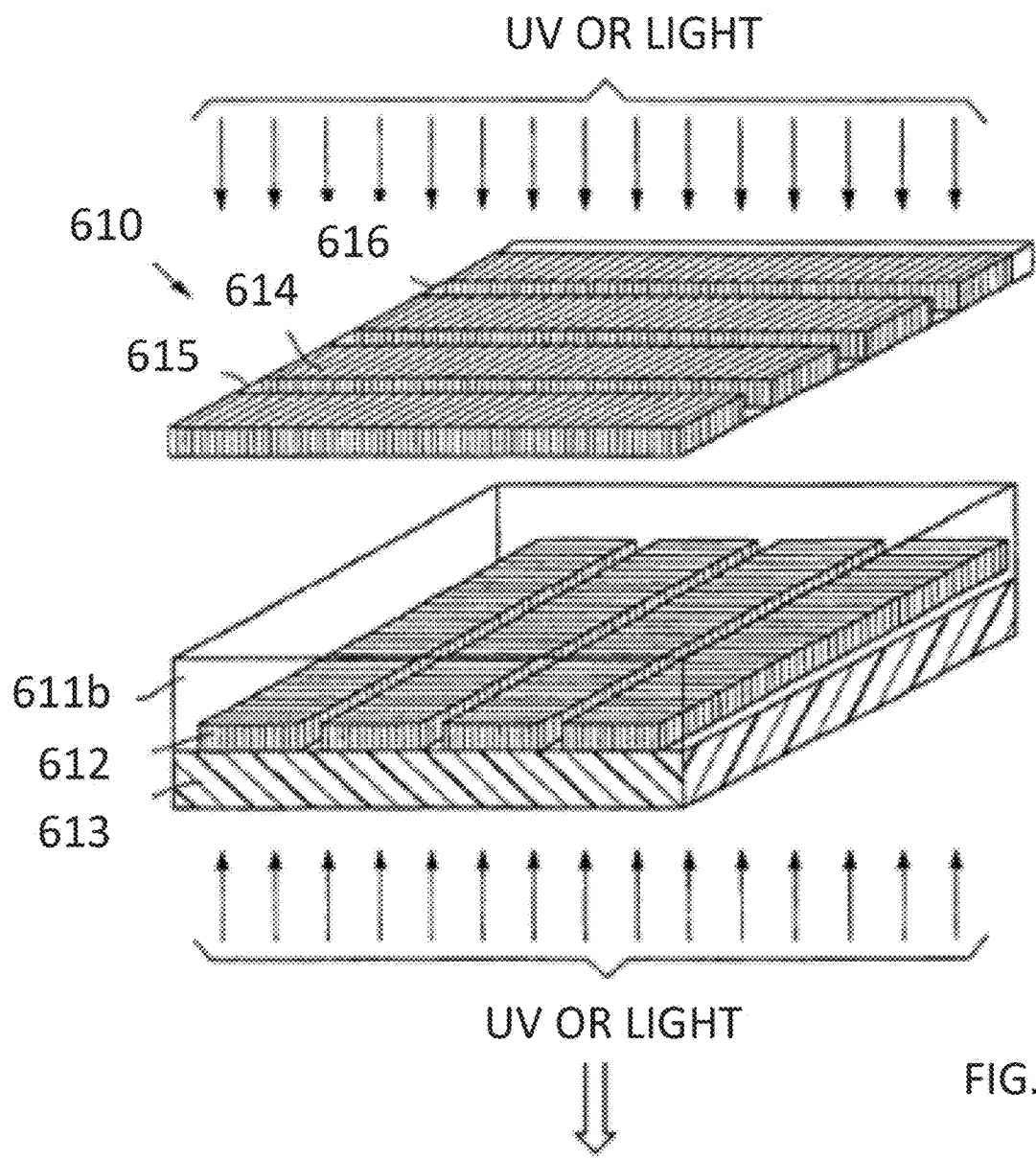
FIGS. 6C and 6D detail an alternate embodiment in which microcells for a benefit agent delivery system are fabricated using photolithography.
Figure 6D:
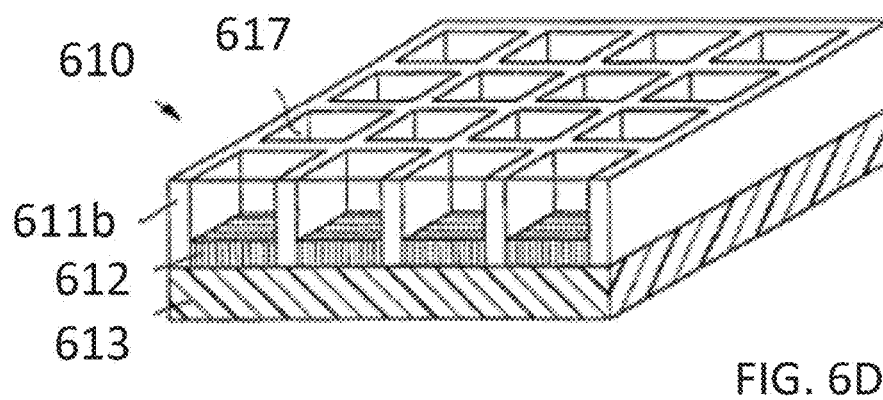

Imagewise Exposure. Still another alternative method for the preparation of the microcell array of the invention by imagewise exposure is illustrated in FIGS. 6C and 6D. When opaque conductor lines are used, the conductor lines can be used as the photomask for the exposure from the bottom. Durable microcell walls are formed by additional exposure from the top through a second photomask having opaque lines perpendicular to the conductor lines. FIG. 6C illustrates the use of both the top and bottom exposure principles to produce the microcell array 610 of the invention. The base conductor film 612 is opaque and line-patterned. The radiation curable material 611a, which is coated on the base conductor 612 and substrate 613, is exposed from the bottom through the conductor line pattern 612, which serves as the first photomask. A second exposure is performed from the "top" side through the second photomask 616 having a line pattern perpendicular to the conductor lines 612. The spaces 615 between the lines 614 are substantially transparent to the UV light. In this process, the wall material 611b is cured from the bottom up in one lateral orientation, and cured from the top down in the perpendicular direction, joining to form an integral microcell 617. As shown in FIG. 6D, the unexposed area is then removed by a solvent or developer as described above to reveal the microcells 617.

The microcells may be constructed from thermoplastic elastomers, which have good compatibility with the microcells and do not interact with the media. Examples of useful thermoplastic elastomers include ABA and (AB)n type of diblock, triblock, and multi-block copolymers wherein A is styrene, α-methylstyrene, ethylene, propylene or norbornene; B is butadiene, isoprene, ethylene, propylene, butylene, dimethylsiloxane or propylene sulfide; and A and B cannot be the same in the formula. The number, n, is ≥1, preferably 1-10. Particularly useful are diblock or triblock copolymers of styrene or α-methylstyrene such as SB (poly(styrene-b-butadiene)), SBS (poly(styrene-b-butadiene-b-styrene)), SIS (poly(styrene-b-isoprene-b-styrene)), SEBS (poly(styrene-b-ethylene/butylenes-b-styrene)), poly(styrene-b-dimethylsiloxane-b-styrene), poly((α-methylstyrene-b-isoprene), poly(α-methylstyrene-b-isoprene-b-α-methylstyrene), poly(α-methylstyrene-b-propylene sulfide-b-α-methylstyrene), poly(α-methylstyrene-b-dimethylsiloxane-b-α-methylstyrene). Commercially available styrene block copolymers such as Kraton D and G series (from Kraton Polymer, Houston, Tex.) are particularly useful. Crystalline rubbers such as poly(ethylene-co-propylene-co-5-methylene-2-norbornene) or EPDM (ethylene-propylene-diene terpolymer) rubbers such as Vistalon 6505 (from Exxon Mobil, Houston, Tex.) and their grafted copolymers have also been found very useful.

The thermoplastic elastomers may be dissolved in a solvent or solvent mixture, which is immiscible with the carrier in the microcells and exhibits a specific gravity less than that of the carrier. Low surface tension solvents are preferred for the overcoating composition because of their better wetting properties over the microcell walls and the fluid. Solvents or solvent mixtures having a surface tension lower than 35 dyne/cm are preferred. A surface tension of lower than 30 dyne/cm is more preferred. Suitable solvents include alkanes (preferably $C_{6-12}$ alkanes such as heptane, octane or Isopar solvents from Exxon Chemical Company, nonane, decane and their isomers), cycloalkanes (preferably $C_{6-12}$ cycloalkanes such as cyclohexane and decalin and the like), alkylbezenes (preferably mono- or di-$C_{1-6}$ alkyl benzenes such as toluene, xylene and the like), alkyl esters (preferably $C_{2-5}$ alkyl esters such as ethyl acetate, isobutyl acetate and the like) and $C_{3-5}$ alkyl alcohols (such as isopropanol and the like and their isomers). Mixtures of alkylbenzene and alkane are particularly useful.

In addition to polymer additives, the polymer mixtures may also include wetting agents (surfactants). Wetting agents (such as the FC surfactants from 3M Company, Zonyl fluorosurfactants from DuPont, fluoroacrylates, fluoromethacrylates, fluoro-substituted long chain alcohols, perfluoro-substituted long chain carboxylic acids and their derivatives, and Silwet silicone surfactants from OSi, Greenwich, Conn.) may also be included in the composition to improve the adhesion of the sealant to the microcells and provide a more flexible coating process. Other ingredients including cross-linking agents (e.g., bisazides such as 4,4'-diazidodiphenyl-methane and 2,6-di-(4'-azidobenzal)-4-methylcyclo-hexanone), vulcanizers (e.g., 2-benzothiazolyl disulfide and tetramethylthiuram disulfide), multifunctional monomers or oligomers (e.g., hexanediol, diacrylates, trimethylolpropane, triacrylate, divinylbenzene, diallylphthalene), thermal initiators (e.g., dilauroryl peroxide, benzoyl peroxide) and photoinitiators (e.g., isopropyl thioxanthone (ITX). Irgacure 651 and Irgacure 369 from Ciba Geigy) are also highly useful to enhance the physicomechanical properties of the sealing layer by crosslinking or polymerization reactions during or after the overcoating process.

Figure 7A:
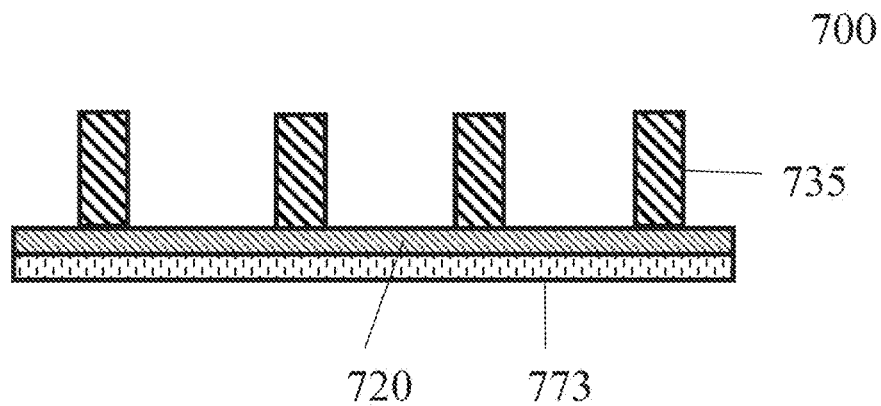
FIGS. 7A-7F illustrate the steps of filling and sealing an array of microcells to be used in a benefit agent delivery system.

A process of manufacturing of an example of the benefit agent delivery system according to the present invention is illustrated in FIGS. 7A-F. The process comprises a step of manufacturing of an empty microcell array 700 by any of the methods described above. As shown in FIGS. 7A, the empty microcell array 700 comprises a backing layer 773, a first electrode layer 720, and a plurality of microcell walls 735. Each microcell of the array includes an opening. In an embodiment, the first electrode layer 720 may be formed on the backing layer 773. The first electrode layer 720 may be a single electrode formed by a continuous conductive material and may be located below or within the backing layer 773. The first electrode layer may be also interrupted by the microcell walls 735. The microcell walls 735 extend upward from the first electrode layer 720 or the backing layer 773 to form the empty microcell array 700. The microcell walls 735 define the opening of each microcell. Prior to filling, the empty microcell array 700 may be cleaned and sterilized to assure that the benefit agents are not compromised prior to use.

Figure 7B:
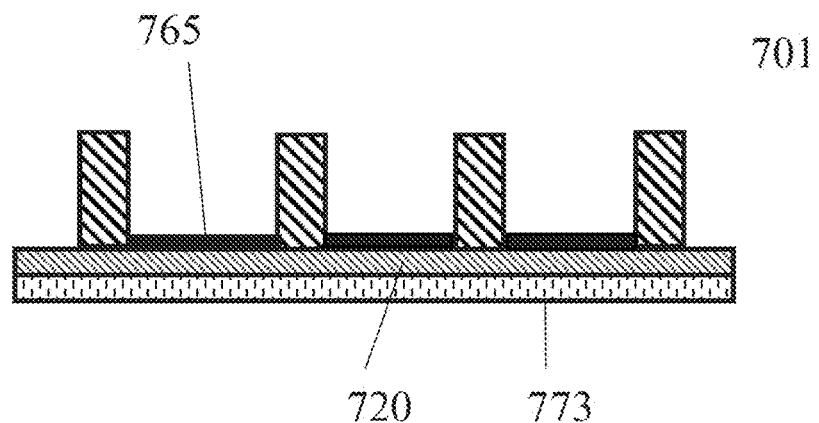

The next step of the manufacturing process involves the making of an open microcell array having a metallic layer. The open microcell array is labeled as 701 in FIG. 7B. Onto the inside surface that is opposite to the opening of each microcell of the empty microcell array 700 a metal is deposited to form metallic layer 765 as shown in FIG. 7B. The metal may be a liquid dispersion in a solvent. The deposition of the metal may be performed via inkjet printing or another coating or deposition method. The deposited metal is dried to form the metallic layer 765 on the microcell surface. Other methods for depositing the metal include gas phase deposition or electrochemical deposition. The metal is selected so that the metallic layer 765 exhibits good barrier properties. Non-limiting examples of metals that provide good barrier properties may comprise silver, copper, gold, platinum, zinc, chromium, nickel and combination thereof.

Figure 7C:
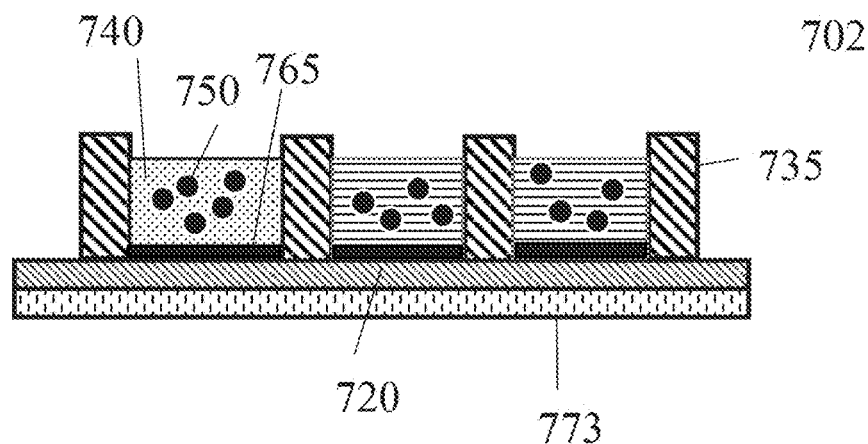

Each microcell of the open microcell array 701 is next filled with appropriate combination of carrier 740 and the benefit agent 750 to form a filled microcell array 702, as shown in FIG. 7C. As mentioned above, different microcells may include different benefit agents. In systems for delivering hydrophobic benefit agents, the combination may be based upon a biocompatible oil or some other biocompatible hydrophobic carrier. For example, the combination may comprise a vegetable, fruit, or nut oil. In other embodiments, silicone oils may be used. In systems for delivering hydrophilic benefit agents, the combination may be based upon water, other aqueous media such as phosphate buffer or polar organic solvents. The combination of benefit agent and carrier need not be a liquid. Gels, such as hydrogels and other matrices, and semi-solid materials may be suitable to deliver the benefit agents. The microcells may be filled using a variety of techniques. In some embodiments, where a large number of neighboring microcells are to be filled with an identical composition, blade coating may be used to fill the microcells to the depth of the microcell walls 735. In other embodiments, where a variety of different composition are to be filled in a variety of nearby microcell, inkjet type microinjection can be used to fill the microcells. In yet other embodiments, microneedle arrays may be used to fill an array of microcells with the correct compositions. The filling may be done in a one-step or multistep process. For example, all of the cells may be partially filled with an amount of carrier. The partially filled microcells are then filled with a composition comprising the carrier and one or more benefit agents to be delivered.

Figure 7D:
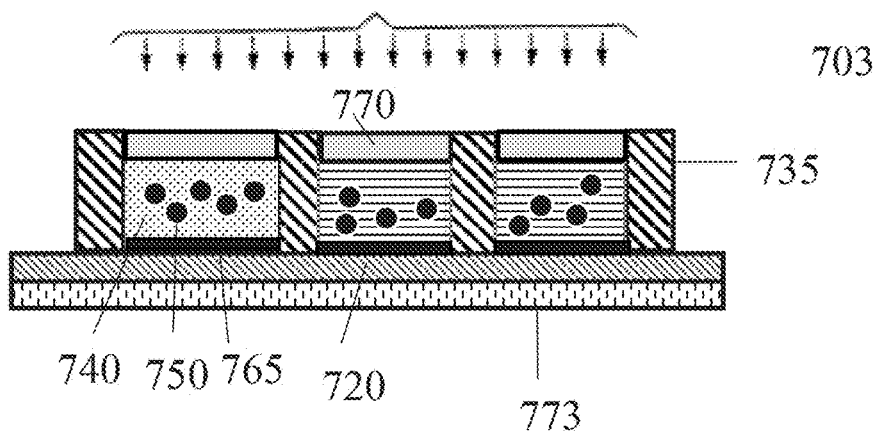

As shown in FIG. 7D, after filling, each microcell of the filled microcell array 702 is sealed by applying a polymer composition onto the opening of the open filled microcells to form a sealed microcell array 703. In some embodiments, the sealing process may involve exposure to heat, dry hot air, or UV radiation. In most embodiments, the polymer should be insoluble or have low solubility in the carrier 740 and the benefit agent 750. The polymer composition of the sealing layer 770 can also be biocompatible and selected to adhere to the sides or tops of the microcell walls 735. FIG. 7D shows that the sealing layer is not continuous and separated by the microcell walls. The sealing layer may be continuous for the whole microcell array and located above the walls, as in FIGS. 1A and 1B. Alternatively, the sealing layer may be continuous and located partially above and partially below the plane defined by the upper surfaces of the plurality of the microcell walls.

In alternate embodiments, a variety of individual microcells may be filled and sealed with the desired mixture by using iterative photolithography. The process typically includes coating of each microcell of the microcell array with a layer of positively working photoresist, selectively opening a certain number of the microcells by imagewise exposing the positive photoresist, followed by developing the photoresist, filling the opened microcells with the desired mixture, and sealing the filled microcells by a sealing process. These steps may be repeated to create sealed microcells filled with other mixtures. This procedure allows for the formation of large sheets of microcells having the desired ratio of mixtures or concentrations.

Figure 7E:
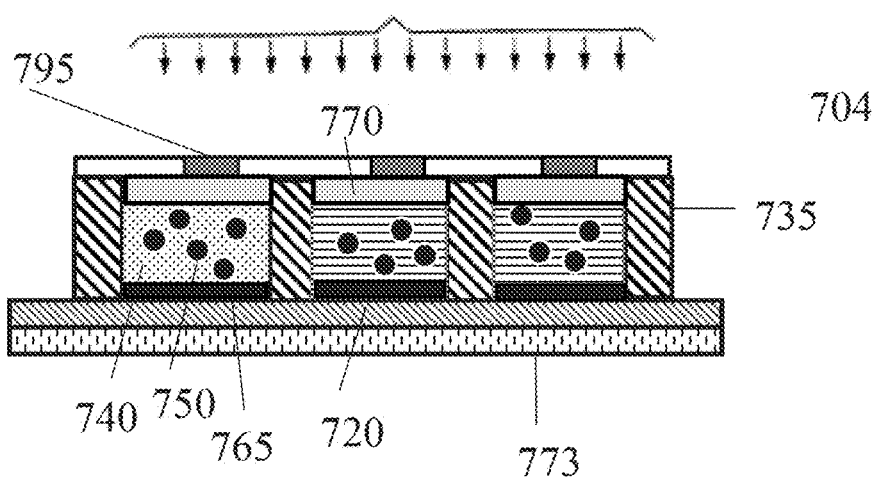

After the microcells are filled and sealed, the sealed microcell array 703 may be laminated with a second electrode layer comprising a plurality of electrodes 795 to form a two-electrode sealed microcell array 704, as shown in FIG. 7E. The second electrode layer may be porous to the benefit agents. An adhesive can be used to attach the second electrode layer onto the sealing layer 770. The adhesive may also be electrically conductive. A suitable biocompatible adhesive for sealing layer is a phenethylamine mixture, such as described in U.S. patent application Ser. No. 15/336,841, filed Oct. 30, 2016 and titled "Method for Sealing Microcell Containers with Phenethylamine Mixtures," which is incorporated herein by reference in its entirety. Accordingly, the final microcell structure is mostly impervious to leaks and able to withstand flexing without delamination or separation of the sealing layer or the second electrode layer. The adhesive used in the adhesive layer may be a pressure sensitive adhesive, a hot melt adhesive, or a heat, moisture, or radiation curable adhesive. The laminate adhesive may be post-cured by radiation such as UV through the top conducting layer if the latter is transparent to the radiation. In other embodiments, the plurality of electrodes may be bonded directly to the sealed array of the microcell. In some embodiments, a biocompatible adhesive is then laminated to the assembly. The biocompatible adhesive will allow benefit agents to pass through while keeping the device mobile on a user. Suitable biocompatible adhesives are available from 3M (Minneapolis. Minn.). The electrode layer comprising a plurality of electrodes 795 may be covered with a release sheet to provide protection. The release sheet may also include adhesives. The benefit agent delivery system may be flexible. This means that it can be folded to a certain extend without breaking, a property similar to a thin rubber sheet.

Figure 7F:
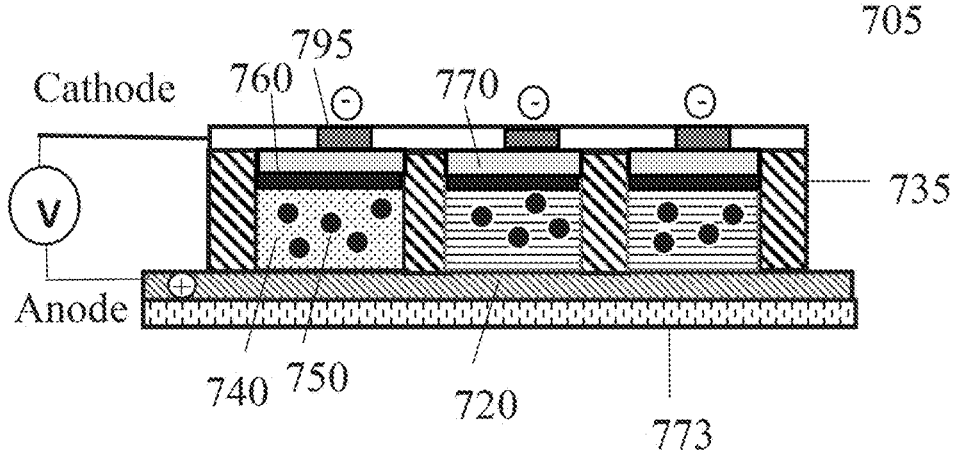

The two-electrode sealed microcell array 704 illustrated in FIG. 7E does prevent the benefit agent from permeating through the sealing layer and the electrode layer when the user does not desire the release of the benefit agent. An effective benefit agent delivery system requires the metallic layer to be located adjacent to the sealing layer 770 when the system is not activated. A non-activated benefit agent delivery system is formed by applying an electric field across each microcell of the two-electrode sealed microcell array 704 of FIG. 7E. The electric field is applied via the plurality of electrodes 795 and electrode 720, wherein the plurality of electrodes 795 serves as the cathode (negative polarity) and electrode layer 72 serves as another (positive polarity), as shown in FIG. 7F. The application of electrical such electric field generates an electric current through each of the plurality of microcells that dissolves metallic layer 765 and redepositing the metal adjacent to the sealing layer 770, forming a metallic layer 760. The newly formed metallic layer 760 exhibits good barrier properties and keeps the benefit agent delivery system at the "off" status for the benefit agent release. To turn on the active ingredient release at a microcell, the electric field is applied across the electrodes at the microcell in a manner that electrode 795 of the microcell is anode (positive polarity) and electrode 720 is cathode (negative polarity). The application of such electric field results in the removal of at least a portion of the metallic layer 760 from the location adjacent to sealing layer 770, creating a pathway for the benefit agent to be delivered from the benefit agent delivery system through the sealing layer 770 and the electrode layer that is adjacent to the sealing layer. Thus, the benefit agent delivery system enables "on demand" control of the release of the benefit agent. The system is reversible. That is, each microcell can be switched to "on" and "off" status repeatedly for many times by controlling the polarity of the applied electric field across the microcell. Another advantage of the system is that the switch is bistable and only requires the application of electrical input when a change in the "on"/"off" status is desired. That is, there is no need to apply an electrical field in time periods when the status is maintain the "on" or "off" status.

FIGS. 7E and 7F show that metallic layer 765 is completely removed from the surface of the microcell that is opposite to the opening (and redeposited onto a surface adjacent to the sealing layer) upon application of the electric field shown in FIG. 7F. This is not necessary and the benefit agent delivery system may be effective, even if only a portion of metallic layer 765 is removed. The same is true for the reverse process, wherein application of electric field of opposite polarity at a microcell causes the removal of the metallic layer 760 and the activation of the corresponding microcell. In some circumstances, such partial removal of a metallic layer 760 is preferred, because the carrier and/or the benefit agent in the plurality of the microcells of the microcell layer may be protected when there are barrier layers at both the opposite surfaces of the microcell. In the absence of barrier layers, a portion of the carrier and/or the benefit agent may diffuse out of the benefit agent delivery system from any of its surfaces, even during the storage of the system or during a period when the delivery of the benefit agent is not desirable.

In a variation of the method of manufacturing illustrated in FIG. 7A to 7F, the sealing layer and the second electrode layer may be integrated in one layer. Thus, the process comprises a step wherein a second electrode layer is deposited on the microcell layer, wherein the second electrode layer spans the opening of each microcell.

In one embodiment, the present invention is a method of for manufacturing of a benefit delivery system. The method comprising the steps of: (a) providing an empty microcell array comprising a first electrode layer, and a microcell layer comprising a plurality of microcells, each microcell of the plurality of microcells including an opening; (b) depositing a metal onto a surface of each microcell of the plurality of microcells, the surface being opposite to the opening of each microcell; (c) filling each microcell of the plurality of microcells with a benefit agent and a carrier; (d) sealing each microcell of the plurality of microcells with a sealing layer, the sealing layer spanning the opening of each microcell of the plurality of microcells; (e) depositing a second electrode layer onto the sealing layer; and (f) applying an electric field between the first electrode layer and the second electrode layer, the first electrode layer being anode and the second electrode layer being cathode for each microcell, wherein the application of the electric field causes at least a portion of the metallic layer of each microcell to be removed from the surface of the microcells that is opposite to the openings and be redeposited onto a surface spanning the opening and adjacent to the sealing layer. The deposition of the metal onto a surface of each microcell of the plurality of microcells, the surface being opposite to the opening of each microcell, can be achieved by a variety of methods. Non-limiting examples include chemical vapor deposition (CVD) from a gas phase or an application on a liquid dispersion of a metal dispersion in a solvent (via spraying, jetting, or coating). In the case of the application of a liquid dispersion, the method of manufacturing must further comprise a step of drying the solvent of the deposited dispersion. The first electrode layer may comprise a single electrode and the second electrode layer may comprise a single electrode or a plurality of electrodes. The first electrode layer may comprise a plurality of electrodes and the second electrode layer may comprise a single electrode. The sealing layer and the second electrode layer of the system may be integrated in one layer.

In another embodiment, the present invention is a method of manufacturing of a benefit delivery system. The method comprises the steps of: (a) providing an empty microcell array comprising a first electrode layer, and a plurality of microcells, each microcell of the plurality of microcells including a first opening and a second opening, the first opening and the second opening being at opposite sides of the microcell, the first electrode layer spanning the second opening; (b) depositing a metal onto the first electrode layer surface that spans the second opening; (c) filling each microcell of the plurality of microcells with a benefit agent and a carrier; (d) sealing each microcell of the plurality of microcells with a sealing layer, the sealing layer spans the first opening of each microcell of the plurality of microcells; (e) depositing a second electrode layer onto the sealing layer; (f) applying an electric field between the first electrode layer and the second electrode layer, the first electrode layer being anode and the second electrode layer being cathode for each microcell, wherein the application of the electric field causes at least a portion of the metallic layer of each microcell to be removed from the surface of the microcells that is opposite to the first opening of each microcell and be redeposited onto a surface spanning the first opening of each microcell and adjacent to the sealing layer. The deposition of the metal onto a surface of each microcell of the plurality of microcells, the surface being opposite to the opening of each microcell, can be achieved by a variety of methods. Non-limiting examples include chemical vapor deposition (CVD) from a gas phase or an application on a liquid dispersion of a metal dispersion in a solvent (via spraying, jetting, or coating). In the case of the application of a liquid dispersion, the method of manufacturing must further comprise a step of drying the solvent of the deposited dispersion. The first electrode layer may comprise a single electrode and the second electrode layer may comprise a single electrode or a plurality of electrodes. The first electrode layer may comprise a plurality of electrodes and the second electrode layer may comprise a single electrode. The sealing layer and the second electrode layer of the system may be integrated in one layer.

The benefit agent delivery system can be an autonomous system that can be easily transported in a small space, such as a handbag, and only needs electric power, which can be a small battery to operate.

Figure 8:
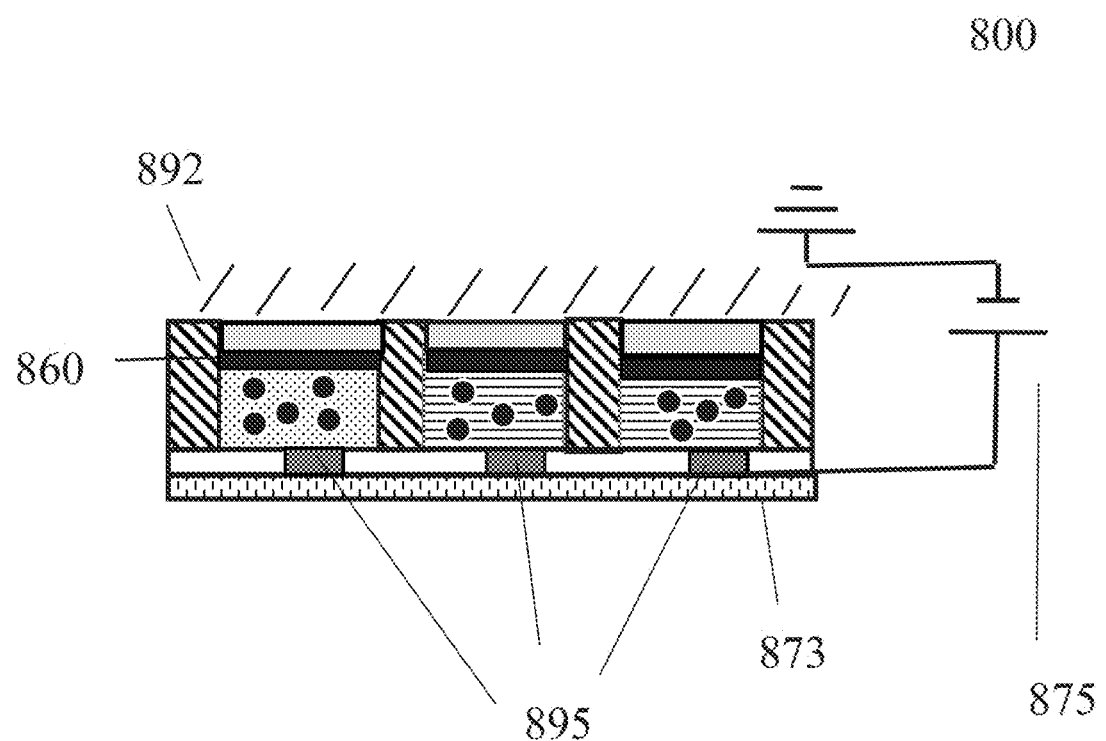
FIG. 8 illustrates an embodiment of a benefit agent delivery system including a plurality of microcells, which can be activated by applied electric field. The microcell is activated by an electrode layer while the conductivity of the skin (or other conductive substrate) provides a grounding electrode.

In some embodiments, it will not be necessary to provide a first electrode layer and a second electrode layer on the opposite sides of the system. For instance, as shown in FIG. 8, the benefit agent delivery system 800 may include a voltage source 875 that is grounded into the surface 892 to which the delivery system is attached. This may be especially useful for transdermal delivery of drugs, where the skin's natural conductance is sufficient to provide a ground potential. The benefit delivery system 800 comprise an electrode layer having a plurality of electrodes 895 and a backing layer 873 adjacent to the electrode layer. Application of an electric field to at least one of the electrodes 895, as shown in FIG. 8, may activate the corresponding microcell and trigger the release of the active agent through the porous electrode layer (or increase the rate of release through the porous electrode layer). It is appreciated that the porous electrode layer comprises a plurality of electrodes whereby each of the plurality electrodes can be independently addressed, e.g., with row-column drivers as in an electro-optic display.

Figure 9:
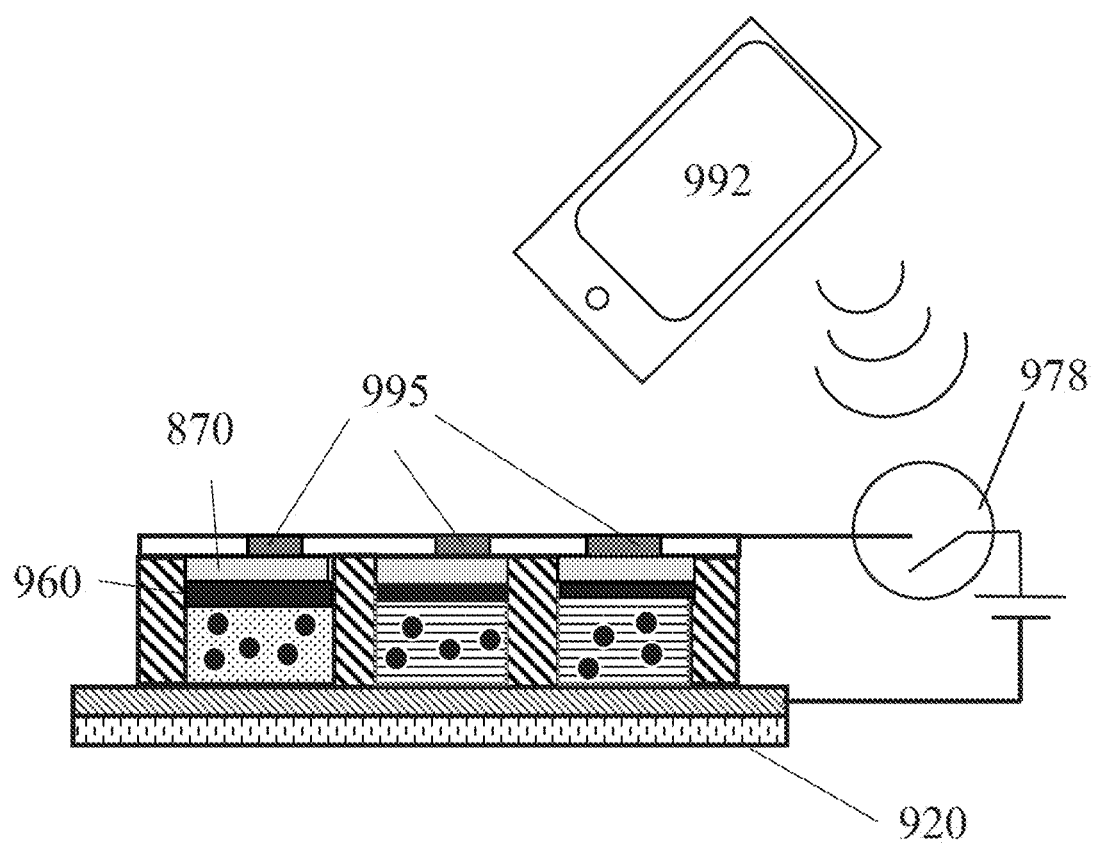
FIG. 9 illustrates an embodiment of a benefit agent delivery system including a plurality of microcells comprising a metallic layer; a switch is coupled to a wireless receiver allowing a user to activate a microcell to trigger the delivery of the benefit agent with an application on a mobile phone or other wireless device.

Advanced embodiments of a benefit agent delivery system will include circuitry to allow the benefit agent delivery system to be activated wirelessly with a secondary device 992, such as a smart phone or smart watch. The benefit agent delivery system comprises an electrode layer comprising a plurality of electrodes 995, a sealing layer 970, a microcell layer comprising a benefit agent, another electrode layer 920, a backing layer 973, and an electronic/digital switch 978. As shown in FIG. 9, this simple system will allow a user to activate electronic/digital switch 978, causing an electric field to activate the corresponding microcells, delivering the benefit agent at a desired surface or space (or increasing the rate of release of the benefit agent).

Figure 10:
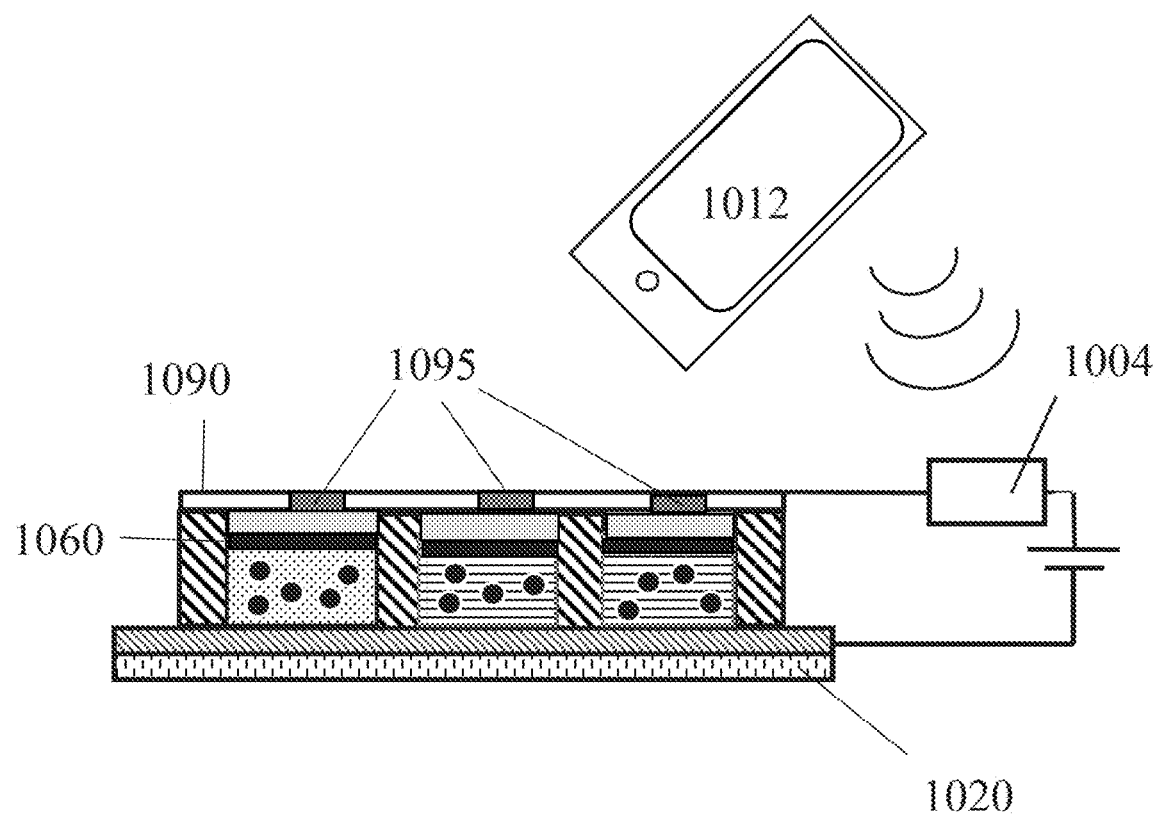
FIG. 10 illustrates an embodiment of a benefit agent delivery system including a plurality of microcells, each of which comprises a metallic layer; a plurality of electrodes is coupled to a matrix driver that is coupled to a wireless receiver, thereby allowing an application to activate the delivery of the desired benefit agent.

In another embodiment, i.e., as shown in FIG. 10, the benefit agent delivery system includes a controller 1004 that independently controls the plurality of electrodes of the electrode layer. The benefit agent delivery system further comprises an electrode layer comprising a plurality of electrodes 1095, a sealing layer 1070, a microcell layer comprising a benefit agent, another electrode layer 1020, and a backing layer 1073. Controller 1004 may also be able to receive wireless signals from a secondary device 1012. The embodiment of FIG. 10 will allow a user to control, for example, the type of benefit agent that is delivered and the amount at the desired time. Using an application on the secondary device 1012 it may be possible to program the benefit agent delivery system to modify the amount of benefit agent based upon the time of day. In other embodiments, the application may be operatively connected to biometric sensors, e.g., a fitness tracker, whereby the application causes the dosage to be turned off if, e.g., the pulse rate of the user exceeds a preset threshold.

When driving the benefit agent delivery systems of FIGS. 9 and 10, NFC, Bluetooth, WIFI, or other wireless communication function is turned on, allowing a user to manipulate the applied voltage across the microcells in order to activate the desired microcells. The activation can be initiated before or after the benefit agent delivery system is applied on the desired surface or location. In addition, benefit agent release adjustment can be achieved at any time when necessary. Because the microcell activation is controlled by a smart watch or a smart phone, the percentage and area for all of the microcells at different activation status is known. This means that all of the usage data may be available to a user or a provider, including the time of the system activation and the amount of the benefit agent(s) administered. Thus, the system may provide a precise control to the user or another person (i.e. a doctor or health provider) to adjust the benefit agent delivery. Because every microcell can be activated independently, the system is programmable. That is, the overall benefit agent delivery can be programmed by activating each of the plurality of microcell when desired. For a benefit agent delivery system, which is designed to deliver benefit agents transdermally, the skin irritation can be mitigated because of the benefit agent can be controlled to be released over a period of time. Additionally, in drug delivery applications, patient compliance can be done effectively, because the smart device that is used to activate the system can remotely communicate with the physician for data sharing.

Figure 11:
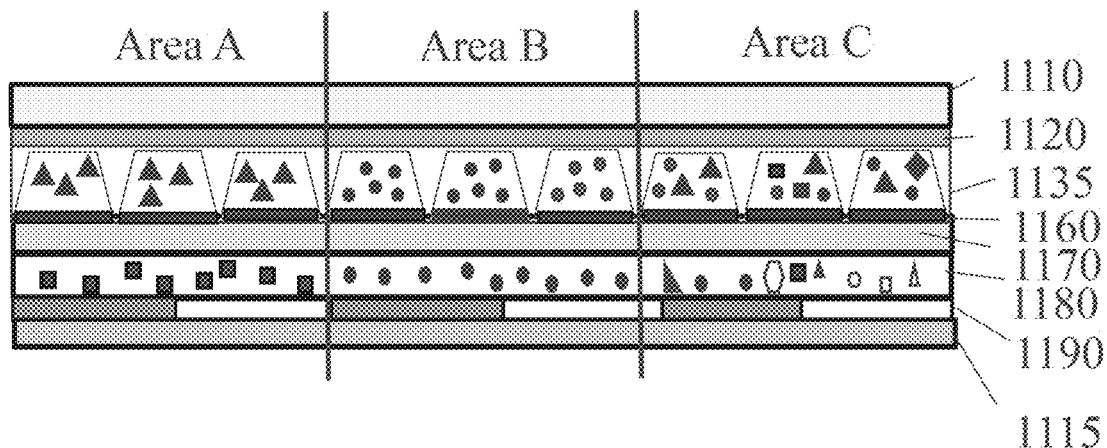
FIGS. 11 and 12 illustrate an embodiment of a benefit agent delivery system wherein the benefit agents are not only loaded into the microcells, but also in other layers such as an adhesive layer and/or a benefit agent-loading layer. Different combinations of benefit agents can be included in different areas of the delivery system.

It is to be understood that the invention is not limited to combinations of benefit agents in the microcell, as different benefit agents can be delivered by adding those benefit agents to additional layers of the benefit agent delivery system. FIG. 11 exemplifies a benefit agent delivery system that comprises in order, a backing layer 1110, a first electrode layer 1120, a plurality of microcells layer 1135, a sealing layer 1170, an adhesive layer 1180, a second electrode layer 1190, and a release sheet 1115. As shown in FIG. 11, the benefit agents may be present in, for example, the adhesive layer.

Area A of FIG. 11 exemplified two different benefit agents being loaded into the plurality of microcell layer 1135 and the adhesive layer 1180. A benefit agent may also be loaded in the adhesive layer. In some embodiments, the two benefit agents may be delivered at the same time. They may also have different delivery profiles. The system also provides a way to deliver different benefit agents with different physical properties, such as different hydrophobicities. For example, if the carrier of the microcell is polar, a hydrophilic benefit agent can be loaded into microcell at high loading. In this embodiment, the adhesive layer may include a hydrophobic benefit agent. Accordingly, the release profile of the two benefit agents can also be adjusted nearly independently. This system overcomes the problem of stabilizing a benefit agent with unfavorable solubility with, e.g., surfactants, capsules, etc.

Area B of FIG. 11 illustrates an embodiment in which the same benefit agent is loaded in both the microcells and the adhesive layer 1180. Depending on the characteristics of the benefit agent, this method can help to load larger quantities of benefit agent into the benefit agent delivery system. This can increase the amount of the benefit agent released and control the release profile.

Area C of FIG. 11 illustrates an embodiment in which a combination of benefit agents is loaded into the microcell, into the adhesive layer 1180, or into both layers. The benefit agents in the microcell composition and adhesive layer can be the same or different. The number of benefit agents in the microcell formulation and the number of benefit agents in the adhesive layer can also be the same or different.

Figure 12:
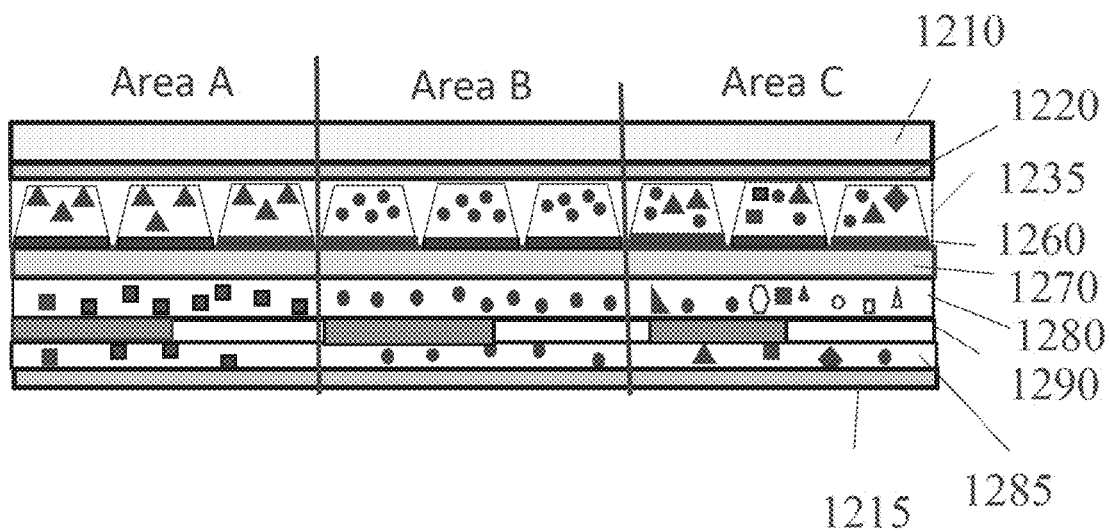

A benefit agent-loading layer 1285 can be included into the benefit agent delivery system adjacent to the release sheet 1215, as shown in FIG. 12. The amount and types of benefit agents in the benefit agent-loading layer 1285 can be independent of the loading in the microcells and/or in the adhesive layer 1280. The benefit agent can be introduced into only some portions of the adhesive layer, or it can present in both adhesive 1280 and the benefit agent-loading layer 1285. The benefit agent-loading layer 1285 may be porous. In another example, the benefit agent-loading layer may be located between the sealing layer 1270 and the adhesive layer 1280.

The benefit agent delivery system may also comprise a porous diffusion layer or a rate control layer that is disposed between the sealing layer and the second electrode layer. If there is an adhesive layer adjacent to the sealing layer, the porous diffusion layer or the rate control layer may be disposed between the adhesive layer and the second electrode layer. The porous diffusion layer or the rate control layer and the adhesive layer may be integrated into one layer, which may have volume resistivity of less than $10^{-10}$ Ohm*cm, or less than $10^{-9}$ Ohm*cm. That is, the porous diffusion layer or the rate control layer may also serve as an adhesive layer, establishing an adhesive connection between the sealing layer and the second electrode layer. The porous diffusion layer or the rate control layer and the second electrode layer may also be integrated into one layer.

The porous diffusion layer may have average pore size larger than 0.2 nm. The rate control layer may have average pore size of 0.2 nm and smaller. The porous diffusion layer and the rate control layer may control the rate of the delivery of the benefit agent by its porosity, pore size, layer thickness, the chemical structure, and the polarity of the material from which it is constructed. Thus, for example, a rate control layer, positioned adjacent to the sealing layer or adjacent to the second electrode layer, and made with a nonpolar polymer such as polyethylene having some porosity level may reduce the rate of delivery of relatively polar benefit agents, such as, for example benefit agents that are soluble or dispersible in water. In addition, a rate control layer having low porosity or higher thickness may slow down the delivery of benefit agents.

As mentioned above, various layers of the benefit agent delivery system may be combined or integrated in a single layer. For example, an adhesive layer and adjacent second electrode layer may also be integrated into one layer. The same may be true for the combination of the porous diffusion layer or the rate control layer and the second electrode layer, the combination of the sealing layer and the benefit agent-loading layer, the combination of the benefit agent-loading layer and the rate control layer, etc.

In an embodiment, the present invention is a method of operating a benefit agent delivery system. The benefit agent delivery system comprises (a) a first electrode layer, (b) a plurality of microcells, each microcell of the plurality of microcells including an opening and containing a metallic layer a carrier and a benefit agent, the metallic layer spanning the opening, (c) a sealing layer, and (d) a second electrode layer. The first electrode layer, the microcell layer, the sealing layer and the second electrode layer are vertically stacked upon each other in this order. The microcell layer and the sealing layer are disposed between the first electrode layer and the second electrode layer. The method of operating the benefit agent delivery system comprises the steps of: providing the benefit delivery system and applying a voltage potential difference between the first electrode layer and the second electrode layer to generate an electric field; the electric field has a polarity causing the removal of at least a portion of the metallic layer from the opening of the microcell onto a surface of the microcell adjacent to the first electrode layer. This removal of at least a portion of the metallic layer enables the delivery of the benefit agent. The method for operating a benefit agent delivery system may further comprise a step of controlling the rate of delivery of the benefit agent by the selection of the applied voltage potential. Higher voltage potential enables higher rate of release of the benefit agent by increasing the rate of removal of part or all the metallic layer from opening of the microcell. The method for operating a benefit agent delivery system may further comprise a step of controlling the rate of delivery of the benefit agent by the selection of the duration of the applied voltage potential. Longer time of the applied voltage potential, enables higher rate of release of the benefit agent by increasing the rate of removal of part or all the metallic layer from opening of the microcell. The sealing layer and the second electrode layer may be integrated in one layer.

In another embodiment, the present invention is a method of operating a benefit agent delivery system. The method of operating of the benefit agent delivery system comprises the steps of (1) providing a benefit agent delivery system comprising (a) a first electrode layer; (b) a microcell layer comprising a plurality of microcells, each microcell of the plurality of microcells including a first opening and a second opening, and containing a metallic layer and a medium, the first opening and the second opening being at opposite sides of the microcell, the first electrode layer spanning over the second opening, and the metallic layer spanning the first opening of each microcell of the plurality of microcells, and the medium comprising a carrier and a benefit agent; (c) a sealing layer located adjacent to the metallic layer of the microcell layer; and (d) a second electrode layer; the first electrode layer, the microcell layer, the sealing layer, and the second electrode layer being vertically stacked upon each other in this order; (2) applying a voltage potential difference between the first electrode layer and the second electrode layer across a microcell that causes the removal of at least a portion of the metallic layer from the first opening of the microcell, enabling the release of the benefit agent from the benefit agent delivery system. The sealing layer and the second electrode layer may be integrated in one layer.

The invention provides for a benefit agent delivery system including a plurality of microcells. Each microcell of the plurality of microcells includes one or two openings and contains a metallic layer and a medium, wherein the metallic layer spans one of the microcell openings. The medium comprises a carrier and a benefit agent. Application of electric field on a microcell results in the removal of at least a portion of the metallic layer from one of the openings of the microcell, enabling the release of the benefit agent from benefit agent system. This disclosure is not limiting, and other modifications to the invention, not described, but self-evident to one of skill in the art, are to be included in the scope of the invention.

The invention claimed is:

1. A benefit agent delivery system comprising:
a first electrode layer;
a microcell layer comprising a plurality of microcells, each microcell of the plurality of microcells including an opening, each microcell of the plurality of microcells containing a metallic layer and a medium, the metallic layer comprising a metal and spanning the opening of each microcell of the plurality of microcells, and the medium comprising a carrier and a benefit agent;
a sealing layer located adjacent to the metallic layer of the microcell layer; and
a second electrode layer;
the first electrode layer, the microcell layer, the sealing layer and the second electrode layer being vertically stacked upon each other in this order;
wherein, when a voltage is applied from a voltage source between the first electrode layer and the second electrode layer across a microcell, at least a portion of the metallic layer is removed from the opening of the microcell and deposited on the microcell surface opposite to the opening.

2. The benefit agent delivery system of claim 1, wherein each microcell of the plurality of microcells further includes a second opening, the opening and the second opening being at opposite sides of each microcell.

3. The benefit agent delivery system of claim 1, further comprising a voltage source that is coupled to the first electrode layer and the second electrode layer.

4. The benefit agent delivery system of claim 1, wherein the second electrode layer is porous.

5. The benefit agent delivery system of claim 1, wherein the sealing layer comprises a polymeric material, the polymeric material being selected from the group consisting of an acrylate, a methacrylate, a polycarbonate, a polyvinyl alcohol, cellulose, poly (N-isopropylacrylamide) (PNIPAAm), poly (lactic-co-glycolic acid) (PLGA), polyvinylidene chloride, acrylonitrile, amorphous nylon, oriented polyester, terephthalate, polyvinyl chloride, polyethylene, polypropylene, polystyrene, polyurethane, and alginate.

6. The benefit agent delivery system of claim 1, wherein the metal of the metallic layer is selected from the group consisting of silver, copper, gold, platinum, zinc, chromium, nickel and a combination thereof.

7. The benefit agent delivery system of claim 5, wherein the sealing layer further comprises a conductive material selected from the groups consisting of carbon black, carbon nanotubes, graphene, a dopant, metal particles, and a conductive polymer.

8. The benefit agent delivery system of claim 1, wherein the carrier is selected from the group consisting of a liquid, a semi-solid, a gel and combinations thereof.

9. The benefit agent delivery system of claim 1, wherein the carrier comprises water, an organic compound, a silicone compound, or a combination thereof.

10. The benefit agent delivery system of claim 1, wherein the benefit agent is selected from the group consisting of a pharmaceutical agent, a vaccine, an antibody, a hormone, a protein, a nucleic acid, a nutraceutical agent, a nutrient, a cosmetic agent, a fragrance, a malodor removing agent, an agricultural agent, an air care agent, an antimicrobial agent, and a preservative.

11. The benefit agent delivery system of claim 1, wherein the sealing layer further comprises a benefit agent.

12. The benefit agent delivery system of claim 1, wherein the sealing layer and the second electrode layer are integrated into one layer.

13. The benefit agent delivery system of claim 1, further comprising a porous diffusion layer or a rate control layer between the sealing layer and the second electrode layer.

14. The benefit agent delivery system of claim 1, further comprising an adhesive layer disposed between the sealing layer and the second electrode layer.

15. The benefit agent delivery system of claim 14, further comprising a porous diffusion layer disposed between the adhesive layer and the second electrode layer.

* * * * *